(12) United States Patent
Horch

(10) Patent No.: US 7,326,969 B1
(45) Date of Patent: Feb. 5, 2008

(54) SEMICONDUCTOR DEVICE INCORPORATING THYRISTOR-BASED MEMORY AND STRAINED SILICON

(75) Inventor: Andrew E. Horch, Seattle, WA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 235 days.

(21) Appl. No.: 11/004,712

(22) Filed: Dec. 2, 2004

(51) Int. Cl.
*H01L 29/423* (2006.01)

(52) U.S. Cl. .................. 257/133; 257/140; 257/146; 257/616; 257/E27.079; 257/E27.193

(58) Field of Classification Search .......... 257/133, 257/140, 146, 616, E27.079, E27.193
See application file for complete search history.

(56) References Cited

U.S. PATENT DOCUMENTS 6,229,161 B1  5/2001  Nemati et al.
6,812,504 B2 *  11/2004  Bhattacharyya .............. 257/133
6,960,781 B2 *  11/2005  Currie et al. ................... 257/19

OTHER PUBLICATIONS

U.S. Appl. No. 10/671,201.
Yun-Gi Kim, et al; Chip Level Reliability on SOI Embedded Memory; Proceedings 1998 IEEE International SOI Conference, Oct. 1998; pp. 135 and 136.
Thomas A. Langdo, Strained silicon on SOI substrates adds up; EE Times, Nov. 14, 2002; 3 pages.
IBM, IBM's Strained Silicon Breakthrough; Image Page, http://www.research.ibm.com/resources/press/strainedsilicon/; Announcement Jun. 8, 2001; 3 pages.
Tomohisa Mizuno, et al; Novel SOI p-Channel MoSFETs With Higher Strain in Si Channel Using Double SiGe Heterostructures; IEEE Trans. on Electron Dev., vol. 49, No. 1, Jan. 2002.
J. Welser, et al, NMOS and PMOS Transistors Fabricated in Strained Silicon/Relaxed Silicon-Germanium Structures; IEDM 92; pp. 1000-1002.
S. Nakamura, et al; Giga-bit DRAM cells with low capacitance and low resistance bit-lines on buried MOSFET's and . . . ; IEEE 1995, IEDM 95, pp. 889-892.
T. Mizuno, et al; Electron and Hole Mobility Enhancement in Strained-Si MOSFET's on . . . ; IEEE Electron Device Letters, vol. 21, No. 5, May 2000; pp. 230-232.
Kem (Ken) Rim, et al; Fabrication and Analysis of Deep Submicron Strained-Si N-MOSFET's; IEEE Transactions on Electron Devices, vol. 47, No. 7, Jul. 2000; pp. 1406-1415.

(Continued)

*Primary Examiner*—Matthew E. Warren
(74) *Attorney, Agent, or Firm*—Fields IP, PS

(57) ABSTRACT

A semiconductor memory device may comprise a thyristor-based memory having some portions formed in strained silicon, and other portions formed in relaxed silicon. In a further embodiment, a thyristor in the thyristor-based memory may be formed in a region of relaxed silicon germanium, while an access device to the thyristor-based memory may have a body region incorporating a portion of a layer of strained silicon. In yet a further embodiment, different regions of the thyristor may be formed in vertical aligned relationship relative to an upper surface of the relaxed silicon germanium. For this embodiment, the thyristor may be formed substantially within the depth of the relaxed silicon germanium layer. In a method of forming the semiconductor device, relaxed silicon may be deposited over exposed regions of a silicon substrate, and a thin layer of strained silicon formed over a portion of the substrate having silicon germanium.

19 Claims, 32 Drawing Sheets

OTHER PUBLICATIONS

Scott E. Thompson, et al, A 90-nm Logic Technology Featuring Strained-Silicon, IEEE Transactions on Electron Devices, vol. 51, No. 11, Nov. 2004; pp. 1790-1797.

Fu-Liang Yang, et al., A 65nm Node Strained SOI Technology with Slim Spacer, 2003 IEEE, 4 pages.

K. Rim, et al.; Fabrication and Mobility Characteristics of Ultra-thin Strained Si Directly on Insulator (SSDOI) MOSFETs; 2003 IEEE; 4 pages.

T. Ghani, et al.; A 90 nm High Volume Manufacturing Logic Technology Featuring Novel 45 nm Gate Length strained . . . Transistors; IEDM 2003; pp. 1-18 (PowerPoint presentation).

T. Ghani, et al.; A 90 nm High Volume Manufacturing Logic Technology Featuring Novel 45 nm Gate Length Strained Silicon CMOS Transistors; 2003 IEEE; 3 pages.

Celeste Biever, Secret of 'strained silicon' chips revealed; www.newscientist.com; Dec. 20, 2003; 2 pages.

K. Ota, et al.; Novel Locally Strained Channel Technique for High Performance 55nm CMOS; 2002 IEEE; 4 pages.

C.-H. Ge, et al.; Process-Strained Si (PSS) CMOS Technology Featuring 3D Strain Engineering; 2003 IEEE; 4 pages.

Chien-Hao Chen, et al; Stress Memorization Technique (SMT) by Selectively Strained-Nitride . . . Device Application; 2004 Symposium on VLSI Tech. Digest . . . ; 2004 IEEE; 2 pages.

A. Shimizu, et al.; Local Mechanical-Stress Control (LMC): A New Technique for CMOS-Performance Enhancement; 2001 IEEE; 4 pages.

Y.M. Sheu, Impact of STI Mechanical Stress in Highly Scaled MOSFETs; 2003 IEEE; 4 pages.

David Lammers; Materials transitions stalk CMOS scaling; EE Times, Jun. 17, 2002; www.commsdesign.com; 4 pages.

Peter Weiss; Straining for Speed; In search of faster electronics, chip makers contort silicon crystals; Science News Online; vol. 165, No. 9; Wk. of Feb. 28, 2004; 8 pages.

Howard Huff; A perspective on enhancing mobilities; Solid State Technology; Jan. 2004; 4 pages.

David Lammers; Intel, TI 'straining' to improve 90-nm silicon; EE Times; Oct. 24, 2003; 2 pages.

Shin-Ichi Takagi; Strained Silicon Technology; short course at International Electron Devices Meeting (IEDM) on Dec. 7, 2003; 74 pages.

* cited by examiner

SEMICONDUCTOR DEVICE INCORPORATING THYRISTOR-BASED MEMORY AND STRAINED SILICON

FIELD

The present invention is directed to semiconductor devices and, more specifically, to a semiconductor device comprising thyristor-based memory devices that may be incorporated with strained silicon structures.

BACKGROUND

A thyristor may be simplistically viewed as a four-layer semi-conducting device, with each layer comprising an alternate N- or P-type material, for example NPNP. In some cases, the thyristor may be represented schematically or modeled as a pair of collector-to-base and base-to-collector tightly coupled bipolar transistors. The opposite ends of the device may be labeled anode-emitter and cathode-emitter while regions therebetween may be referenced as n-base and p-base regions, respectively. In a particular device, a control electrode may be operable to influence one of the intermediate base regions during operation of the thyristor.

In a thin capacitively-coupled thyristor device, one of the base regions of the thyristor may be capacitively coupled to an electrode. In some applications, the electrode capacitively coupled to the base may be controlled to assist switching of the thyristor; e.g., switching from a conducting state to a blocking state. Further, the base region of the thyristor may be made thin enough so that the capacitor electrode, when activated, can fully deplete the base region of minority carriers to assist transition of the thyristor into its blocking state.

In some cases, the thyristors may be described as a type of negative differential resistance ("NDR") device, which may be used in forming a thyristor-based memory device. Some propose that the use of these types of memory could potentially provide the speed of conventional static random access memory ("SRAM") while at the same time the density of dynamic random access memory ("DRAM"). Additionally, these devices might also be capable of fabrication using available process equipment of the complementary metal-oxide semiconductor ("CMOS") fabrication industry.

In some applications, thyristors and/or thyristor-based memory arrays might also be embedded or integrated together with other semiconductor logic devices. For example, an integrated logic device may use a memory cell to temporarily hold an input value before the input value is to be communicated to further logic circuitry for calculations. Thus, a logic device may use a thyristor-based memory as a component for temporary storage before performing a system calculation via other components of the device.

One consideration in any type of semiconductor device may be its switching speed—the time needed for a device to transition from storing or outputting one value to storing or outputting another value. Another consideration may be the propagation speed of these devices. A variety of factors may influence the propagation and switching speed of a semiconductor device. Naming a few, such factors may include carrier mobility, device resistance, device capacitance, and the like.

SUMMARY

According to an embodiment of the present invention, a semiconductor device with a thyristor-based memory may have some portions thereof formed within strained silicon and other portions formed in relaxed silicon.

In a further embodiment, a thyristor-based memory cell may comprise a thyristor and an access device (e.g., transistor). At least some of the regions associated with defining the thyristor and the access transistor may be formed in regions having strained silicon over relaxed silicon germanium ("SiGe").

In a further embodiment, a thyristor of the thyristor-based memory may be formed in relaxed silicon, while an access device, which may comprise a metal-oxide semiconductor field effect transistor ("MOSFET"), may have its body region incorporating regions of the substrate that include a layer of strained silicon. In yet a further embodiment, the different regions of the thyristor may be vertically aligned with respect to each other and relative to an upper surface of the relaxed silicon. For this embodiment, the thyristor may comprise a height that is substantially less than the depth of the relaxed silicon layer.

In another embodiment, a semiconductor device may comprise a region (e.g., island) of relaxed silicon and a region of strained silicon. A thyristor-based memory may be defined at least in part in the region of relaxed silicon.

In a further embodiment, a shallow isolation trench may be disposed between the regions of strained silicon and the regions of relaxed silicon. In a particular embodiment, an oxide spacer may be disposed against sidewalls of the strained silicon and that of the relaxed silicon for lining the trench therebetween. In another further embodiment, both of the relaxed and strained regions may comprise semiconductor material bonded to/over an insulator.

In another embodiment, a method of forming a semiconductor device may comprise forming islands of relaxed silicon and islands of strained silicon over relaxed silicon germanium. In one embodiment, a layer of relaxed silicon germanium may be formed on a silicon substrate. At least one island or region of relaxed silicon germanium may be etched to expose a region of the silicon substrate. An oxide barrier may then be disposed as a spacer against the sidewall defined by the island of the silicon germanium. In another particular embodiment, an isolation trench may be disposed between the region of the exposed silicon and the remaining region of the relaxed silicon germanium.

In a further embodiment, the method of forming the semiconductor device may further comprise forming (e.g., epitaxially depositing) relaxed silicon over the exposed regions of the silicon substrate. A thin layer of strained silicon may then be formed over the relaxed silicon germanium. In a particular further embodiment, the strained silicon may be formed by growing the silicon epitaxially over the relaxed silicon germanium.

In another particular embodiment, a method of forming islands of relaxed silicon and islands of strained silicon over relaxed silicon germanium may comprise forming regions of relaxed silicon and relaxed silicon germanium over a silicon substrate on a first wafer. The first wafer with the relaxed silicon and the relaxed silicon germanium may then be bonded to an oxide layer of a second handling wafer (e.g., a silicon-on-insulator, "SOI"-type wafer). Surface regions of the relaxed silicon and silicon germanium may then be split apart as a thin surface layer (bonded to the oxide of the second wafer) and separated from subsurface layers of the first wafer. Planarization may smooth the parted surface of the layer bonded to the oxide. Once the surface has been planarized, epitaxial silicon may be formed over the exposed regions of the relaxed silicon germanium and maybe also the relaxed silicon. The silicon deposition over the silicon germanium may affect strained silicon while that over the silicon, if provided, may be termed relaxed silicon. In a further embodiment, one or more electrical devices (e.g., MOSFETS, thyristors, etc.) may be formed in the island of strained silicon.

In another further embodiment, a method may comprise forming an access device (e.g., a MOSFET) of a thyristor-based memory cell in the island of strained silicon, while one or more peripheral high-voltage devices for thyristor-based memory may be formed in relaxed silicon. In yet a further embodiment, one or more of the devices formed in the relaxed silicon may comprise a thyristor.

BRIEF DESCRIPTION OF THE DRAWINGS

The subject matter of embodiments of the present invention may be understood by reference to the following detailed description, and with reference to the accompanying drawings, in which.

DETAILED DESCRIPTION

Figure 1A:
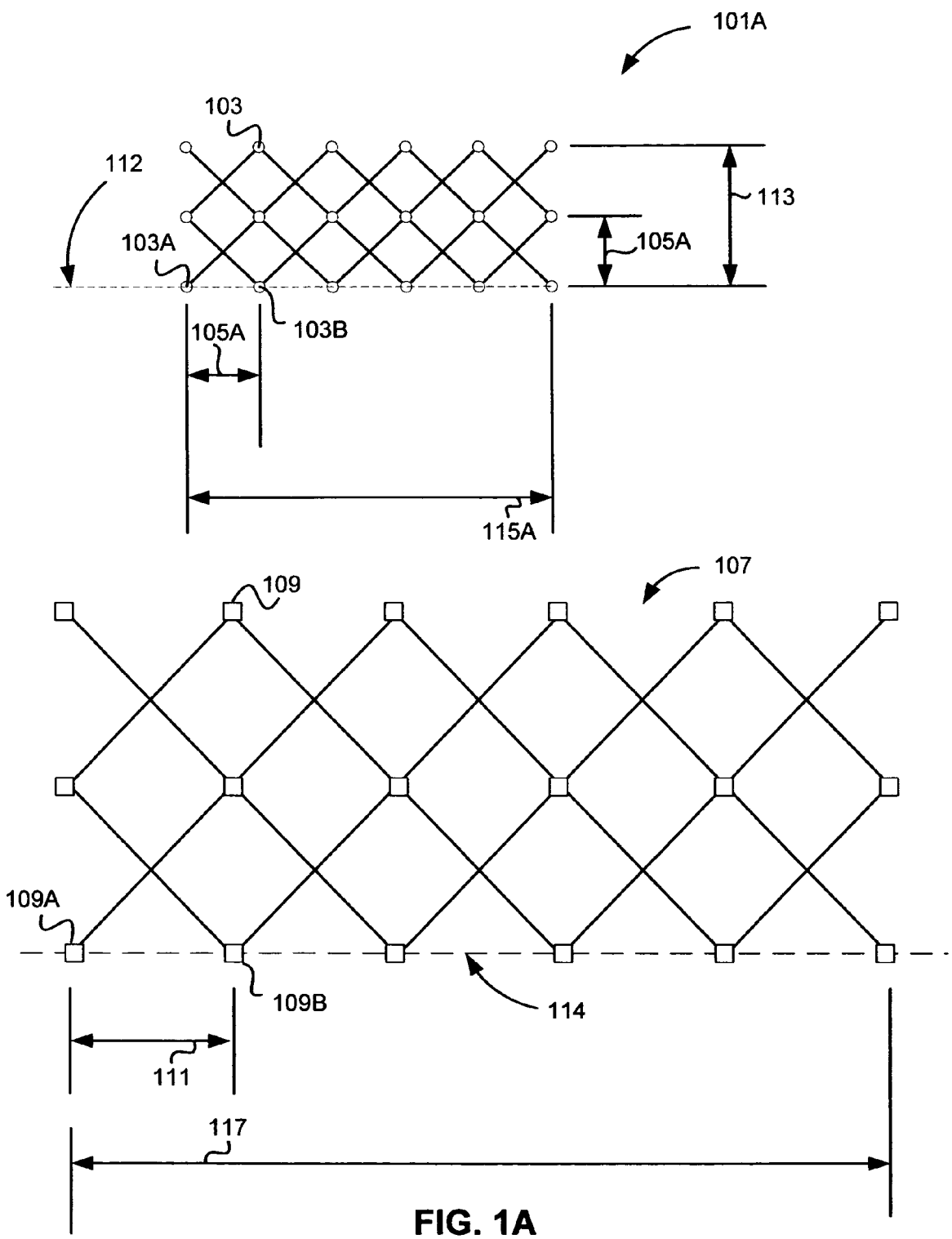
FIG. 1A is a simplified schematic representation of atoms of a relaxed silicon crystal lattice and atoms in a relaxed silicon germanium crystal lattice for relative (exaggerated) comparison, as may be useful for gaining an understanding of certain embodiments of the present invention.

While embodiments of the invention may be amenable to various modifications and alternative forms, some specifics thereof may be described relative to simplified drawings. It should be understood, however, that the various embodiments of the invention need not necessarily be limited to the specific simplified examples described. On the contrary, the present disclosure is intended to cover all modifications, equivalents, and alternatives falling within the spirit and scope of the presently disclosed embodiments of the invention and as defined by the appended claims.

In the description that follows, readily established circuits and procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor or bulk material. Such portion may have one or more interfacing layers of material including, but not limited to Si, Ge, silicon germanium, and all other materials that may have been formed on or within the substrate. Layered semiconductors comprising the same or different semi-conducting material such as Si/Si, Si/SiGe and SOI may also be included as may be understood, based on context, by those of ordinary skill in the present art. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with a substrate.

As referenced herein, portions of circuit elements (e.g., a transistor or thyristor) may be described as being formed in, at or on a semiconductor substrate. Such alternative terms in/at/on may be used individually merely for purposes of convenience. In the context of forming semiconductors, such terms may collectively reference portions of a semiconductor element that may be within and/or on a starting structure or material.

As to the term "surface," it may refer to the surface of an embedded material or layer or sheet of material. The "surface" may have one or more layers of materials against it. Surface, depending on context, may not necessarily be a surface exposed only to air or other non-semiconductor materials. The term surface may be used merely for clarity or convenience to describe examples of layering of materials on each other (e.g., on or against the surface of the layer below the referenced layer). Nor is a "surface" or "upper surface" necessarily a "top surface" of a structure or device that may comprise a plurality of layers of materials. For example, a substrate "surface" may interface with a layer of oxide, nitride, strained silicon, etc. Such surface descriptor may be understood, therefore, to serve as a frame of reference for establishing spatial interrelationships between various materials, layers and/or features (e.g., vertical, horizontal, etc.).

As used herein, the terms "island," "region," or "portion" may be alternative expressions and may be used individually merely for purposes of convenience. An "island" may, depending on the context, comprise a "region" or a "portion," or vice versa.

As used herein, the terms "interface", "boundary", "border", "junction" may, depending on context, be alternative terms and may be used individually merely for the purpose of convenience. For example, in discussing the junction between two materials or structures, reference may be made to an "interface", "boundary", or "border". Depending on the context, and as understood to those skilled in this art, the term "bond" might also refer to an "interface", "boundary", "border", or "junction".

Certain semiconductor devices, including MOSFETS, may comprise for some embodiments of the present invention, strained silicon that may impart improved performance for the device as compared with comparable semiconductor devices absent the strained silicon. The improved performance may include, e.g., an increase in carrier mobility (e.g., the rate of electron flow through the devices), lower resistance and also reduced power consumption.

To assist with an understanding of certain embodiments, a strained silicon structure, referencing the schematic cross-sectional view of FIG. 1A, in a portion of a substrate may initially be referenced as an idealized silicon lattice 101A with intrinsic silicon atoms 103. The silicon crystal lattice 101A may comprise a lattice constant of substantially linear distance 105A along an axis 112. In this illustrated cross-sectional view, two neighboring atoms 103A, 103B may be represented as sliced or intersected by a plane of this illustrated cross-section, as a part of six consecutive horizontally aligned (with respect to line 112) silicon atoms along the axis 112. These horizontally-aligned atoms may be understood to be characterized with a given spatial periodicity along the length associated with a horizontal distance 115A.

Likewise, three consecutive and vertically aligned (with respect to line 112) silicon atoms 103 of the idealized rendering of the silicon crystal lattice 101A may be understood to be characterized with a spatial periodicity along the length associated with vertical distance 113. The dimensions along the horizontal 115A and vertical 113 may be understood as intrinsic idealized distances, and are offered in this view to merely ease understanding of the direction and magnitude of potential strain or stretch that may be imparted thereto. It may be further understood that the illustrated representations need not correspond to actual dimensions present in a plane of an actual silicon crystal lattice, which might present a diamond cubic lattice configuration.

Further referencing FIG. 1A, a cross-sectional plane through a rendering for an idealized portion of silicon germanium crystal lattice 107 may comprise atoms 109 (SiGe) of a lattice constant 111 along horizontal 114 (in the cross-sectional plane) that may intersect two neighboring atoms 109A, 109B of, e.g., six horizontally-aligned atoms (with respect to line 114 of the cross-sectional plane) across horizontal distance 117. Again, distance 117 may be represented as rendering an idealized distance for purposes of easing understanding of certain concepts for embodiments relating to strained crystal lattices.

The magnitude of lattice constant 105A associated with silicon crystal lattice 101A may be considerably smaller than the magnitude of lattice constant 111 as may be associated with silicon germanium crystal lattice 107. The difference in the magnitude between the two lattice constants 105A and 111 may be understood to cause strain, for example, if the silicon crystal lattice is formed (e.g., epitaxially) in bonded relationship over the silicon germanium crystal lattice. The strain may be due to a tendency of the two different contiguous semiconductor materials to expand or contract magnitude of lattice constants to achieve crystalline alignment at an interface defined between the different materials. Specifically, the silicon lattice constant of dimension 105A may expand to accommodate that of silicon germanium 111; which, in turn, may contract to achieve a common magnitude of lattice constant at their junction.

Further referencing FIG. 1A, absent bonding in silicon-germanium, silicon crystal lattice 101A may be referred to as "relaxed silicon" because lattice constant 105A has not been expanded or contracted to match, or align with another. In this context, the term "relaxed" may refer to an unchanged or unaffected state for the natural lattice constant of a lattice (e.g., lattices 101A, 107).

The lattice constant 105A of the silicon may affect an electrical resistance therein. If an electrical current travels through the lattice 101A, electrons may be simplistically theorized to collide with or be deflected by atoms 103 of the lattice 101A. Therefore, the probability of an electron being able to travel a given distance before being deflected by a silicon lattice atom 103 may be inversely proportional to the magnitude of the lattice constant 105A.

Figure 1B:
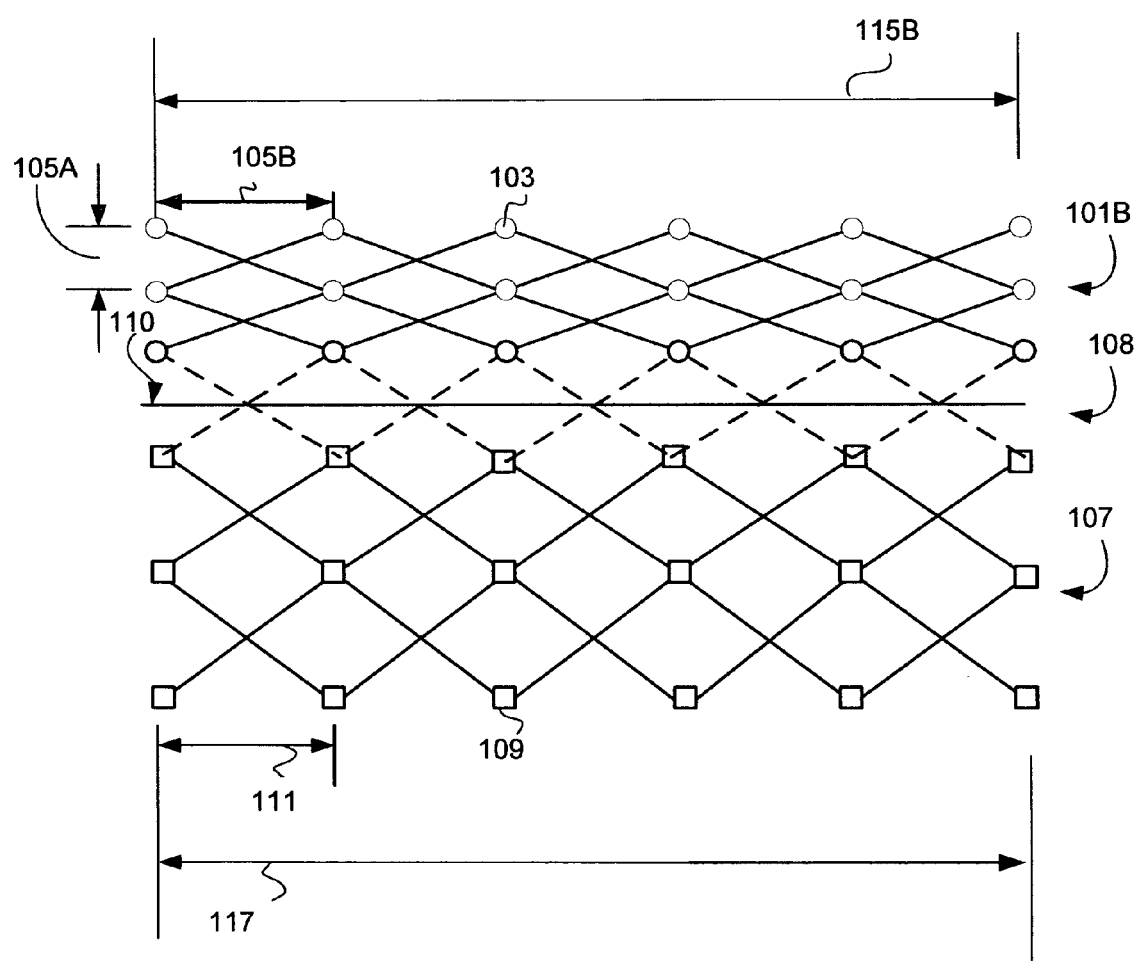
FIG. 1B is a simplified schematic representation of atoms of a strained silicon against atoms of a silicon germanium as may be useful for gaining an understanding of certain embodiments of the present invention.

Referencing FIG. 1B, strained silicon 101B may be formed over the crystal lattice of silicon-germanium 107 to define an interface 108 therebetween. A plane 110 (perpendicular to the line of sight) may be defined by and extend substantially parallel to interface 108. The two lattice structures 101B, 107 of the silicon and the silicon germanium, respectively, may have a tendency to align (e.g., parallel to plane 110) to achieve a common lattice (atom interspacing) at their interface 108. That is, at interface 108, lattice constant 105B of silicon crystal lattice 101B along the horizontal may comprise a magnitude substantially equal to the magnitude of lattice constant 111 of silicon germanium crystal lattice 107. For example, the horizontal distance attributable to six silicon atoms 103 may comprise a distance 115B, which may be substantially equal to the horizontal distance occupied by six atoms 109 of the silicon germanium crystal lattice 107. In a vertical direction (e.g., perpendicular to plane 110), lattice constant 105A may be substantially unchanged relative to its relaxed state.

Along the horizontal (e.g., parallel to plane 110), lattice constant 105B for atoms of the crystalline structure of the silicon may be described as having a magnitude greater (strained) than that of relaxed state. Therefore, the silicon proximate the interface may be referred to as "strained silicon". It may be understood that the strain in the crystal lattice 105B of the silicon may gradually decrease at elevations further away from the interface. But, if the silicon layer is sufficiently thin, the silicon atoms may, at least to some extent, maintain a substantially constant lattice spacing 105B (e.g., retain their lateral "strain") throughout the layer.

But, if sufficiently thick, the lattice spacing at regions distant the interface may return to a relaxed lattice constant of relaxed silicon. The thickness over which the silicon may remain "strained" may vary depending on a variety of factors (e.g., degree of strain, dopant profile, curing temperature, etc.).

As briefly discussed before, carrier mobility (e.g., electron or hole mobility) and electrical resistance may be influenced by the magnitude of the strain in the silicon lattice 101B. For example, electrons flowing through strained silicon may be theorized to experience fewer deflections than would be the case if they were flowing through a lattice of relaxed silicon. The reduced collision probability may, in turn, result in higher electron and hole mobility through the lattice 101B and may also result in lower electrical resistance. Therefore, the voltage necessary to maintain a given current drive through strained silicon may be less than the voltage that might otherwise be required to maintain the given current drive through relaxed silicon.

The amount by which the resistance may be lowered and the mobility enhanced in some embodiments may be proportional to the percentage (e.g., molar fraction) of germanium in the silicon germanium material 107. Therefore, at least some aspects of the device performance may be enhanced with incorporation of a higher proportion of germanium atoms in the silicon germanium so as to induce, therefore, greater "strain" in the silicon lattice proximate the interface 110.

Ignoring some of the dependencies on device characteristics such as doping profile, channel length, substrate structure, etc.; substantial increases (e.g., 60 percent) in electron mobility may be achievable with less than about 10 to 15 percent germanium in the silicon germanium layer—e.g., $Si_{0.9}Ge_{0}$. Increases in hole mobility, on the other hand, may be more modest (e.g., 5 percent). Substantially greater hole mobility (e.g., 20 percent increase) may be achievable (again depending on particular device characteristics) with greater proportions of germanium in the silicon germanium (e.g., $Si_{0.65}Ge_{0.35}$). But, high proportions of germanium (e.g., greater than 20 percent) in the silicon germanium may present some difficulties for certain applications. For example, it may typically be viewed difficult to combine such strained silicon embodiments with silicon-on-insulator (SOI) technologies where large anneal temperature may be required.

SOI technology may be understood to allow realization of thin-film devices, e.g., MOSFETs (with fully depletable body regions) of low operating voltage. These thin-film devices have sometimes been used to enable higher speed and improved switching characteristics, depletion effects, silicon efficiencies and other benefits. One typical difficulty, however, in combining SOI technology with strained silicon technology may be that a high annealing temperature may be required to form an oxide layer within the substrate for an SOI structure. For example, a method of forming an oxide layer below a relaxed silicon germanium layer may typically comprise formation of a buried oxide by an oxygen implant (SIMOX) technology. However, that technology may require a high annealing temperature during the formation of the oxide layer.

It may be noted that the melting point of silicon germanium may decrease as the percentage of germanium increases. In a particular device, when the proportion of germanium in silicon germanium is above 20 percent, the SIMOX annealing temperature may damage the lattice structure of the silicon germanium material.

To avoid damage from the anneal, the percentage of germanium in the silicon germanium might, therefore, need to be reduced. Overcoming this potential compromise, by some embodiments of the present invention, as described below with reference to FIGS. 8A-F, may enable the formation of a silicon-germanium over oxide, in which the silicon germanium layer may comprise a germanium of molar concentration ratio that may exceed 20 percent.

In further embodiments, thyristor-based memory technology may be integrated with strained silicon technologies that may allow portions of a thyristor-based memory to benefit from the advantages offered by strained silicon. In particular embodiments, an entire thyristor-based memory cell may be formed in strained silicon. In other embodiments, particular devices (e.g., MOSFETs) may be formed in strained silicon regions while others (e.g., thyristor) may be formed in relaxed regions. In the case of MOSFETS, a MOSFET and a thyristor may define separate parts of a logic device (e.g., a logic device that incorporates thyristor-based memory cells). For example, the MOSFET may be part of a thyristor-based memory and may be operable as an access device for enabling selective access of the thyristor.

At least three different approaches may be used to integrate strained silicon with thyristor-based memory components: 1) Form all devices on a substrate comprising a thin layer of strained silicon over relaxed silicon germanium; 2) Form some devices (e.g., subsurface thyristors) in a region of a substrate comprising relaxed semiconductor material and form other devices (e.g., MOSFETs) in a region of the substrate comprising strained silicon (e.g., a-layer of strained silicon over relaxed silicon germanium); and 3) Form islands of strained silicon (e.g., over and interfacing with a region of relaxed silicon germanium) and islands of relaxed silicon (e.g., over silicon substrate or on a "surface" of a silicon substrate) and build devices in one type of island and other devices in the other depending on design considerations.

Figure 2:
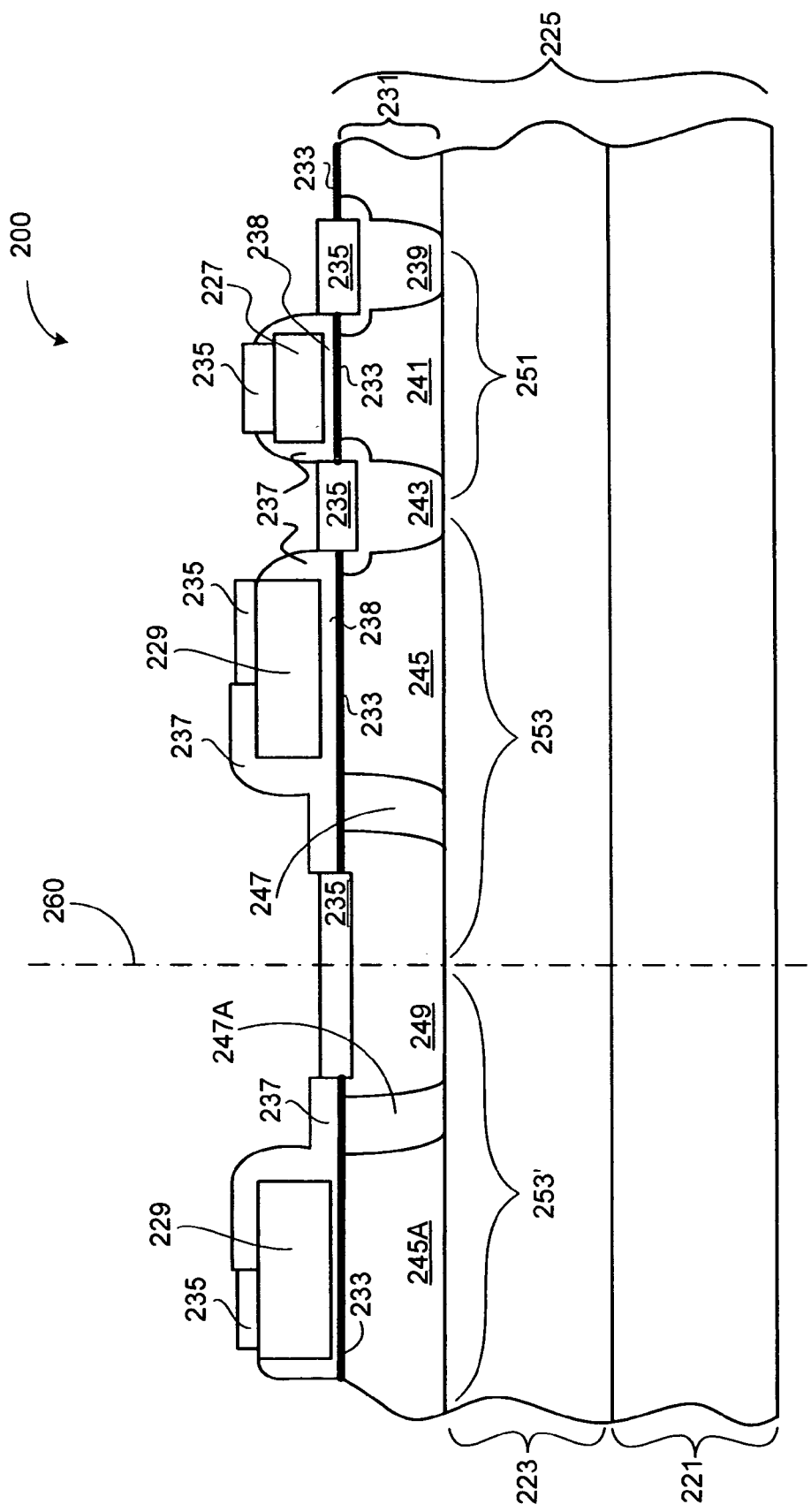
FIG. 2 is a simplified cross-sectional view of a portion of a thyristor-based memory, as may be associated with certain embodiments of the present invention, showing a thin capacitively-coupled thyristor and an access device; the thyristor and transistor may incorporate a layer of strained silicon proximate their electrodes.

Referencing FIG. 2, a portion of a thyristor-based memory device 200 may comprise a layer of strained silicon 233 that may be vertically disposed over and attached to (e.g., on the surface of) a thicker layer of relaxed silicon germanium 231. The relaxed silicon germanium 231 may be vertically disposed on (e.g., defining an interface with) oxide 223 and the oxide may be vertically disposed on silicon 221 or other supporting substrate material. Layers 233, 231, 223, 221, may be viewed, in particular contexts, as parts of a single substrate or substrate structure 225. In other contexts, the layer of strained silicon 233 may be discussed as having an interface to a surface of a substrate comprising layers 231, 223, 221.

Strained silicon 233 and relaxed silicon germanium 231 may comprise horizontally aligned (e.g., with respect to the layers 233, 231) doped semiconductor regions defining thyristor 253 and access device 251 (e.g., MOSFET). The thyristor may comprise anode-emitter 249, n-base 247, p-base 245, and cathode-emitter 243. Access device 251 may comprise drain/source region 243 (a part of which may be electrically in common with cathode-emitter region 243 of the thyristor 253), p-channel region 241, and source/drain region 239. Strained silicon 233 and mirror image thyristor 253' and MOSFET over silicon germanium layer 231 may be formed about mirror axis 260 as mirror-image left to right devices.

Access device 251 may comprise a gate electrode 227. Electrode 227 may be electrically coupled to a first wordline (not shown) and may comprise an upper surface layer of silicide 235. Gate electrode 227 may be capacitively coupled to p-body region 241 via dielectric 238. The electrode 227 may be operable under a voltage bias to induce an inverted channel (not shown) in p-channel region 241. In particular embodiments, strained silicon 233 may have a thickness to accommodate a majority or substantial thickness for such inverted channel. The strained silicon in the inversion channel of p-channel 241 may thus help to improve the performance of MOSFET 251 by increasing its carrier mobility, improving switching speed, and decreasing the voltage that might otherwise be required to drive current through the inversion channel.

A capacitor electrode 229 may be capacitively coupled to p-base region 245 of thyristor 253 via dielectric 238. Strained silicon 233 may comprise most or all of a portion of the lateral extent of p-base 245 proximate dielectric 238. The capacitive electrode may be electrically coupled to a second wordline (not shown) and may further comprise a partial surface region with silicide 235. Although shown with similar thickness dielectric, the capacitor electrode dielectric may, in some embodiments, comprise material and/or thickness different than that for the gate electrode 227.

At least part of the surfaces of capacitor electrode 229, gate electrode 227, source drain 239, drain source and cathode-emitter 243, and anode-emitter 249 may have silicide 235 formed over them. Spacers 237 (e.g., oxide, dielectric material) may surround at least a portion of capacitor electrode 229 and gate electrode 237. This dielectric may also assure a lateral spacing of the silicide 235 relative to the base region 247.

In the embodiment described with reference to FIG. 2, both the thyristor 253 and access device 251 are formed in regions of the substrate 225 that comprise strained silicon 233. It may be theorized that at least in some particular substrates, the band gap energy between the valence band and the conduction band of the substrate atoms may be smaller in germanium than in silicon. In particular embodiments, a silicon germanium substrate may be more prone to leakage currents than a silicon substrate. Because of these considerations, the devices formed therein should be capable of tolerating such leakage currents.

In some embodiments, all devices of the thyristor-based memory, including the thyristor and the access MOSFET may be formed in the strained silicon regions of the substrate. Alternatively, the MOSFET with the p-body region 241, the source and drain regions 239, 243 (all or part of 243 may be in common with cathode-emitter region 243 of the thyristor 253) may be formed in the regions with strained silicon and the other regions cathode-emitter 243, p-base 245, n-base 247, anode-emitter 249 of the thyristor 253 may be formed in relaxed silicon.

Figure 3:
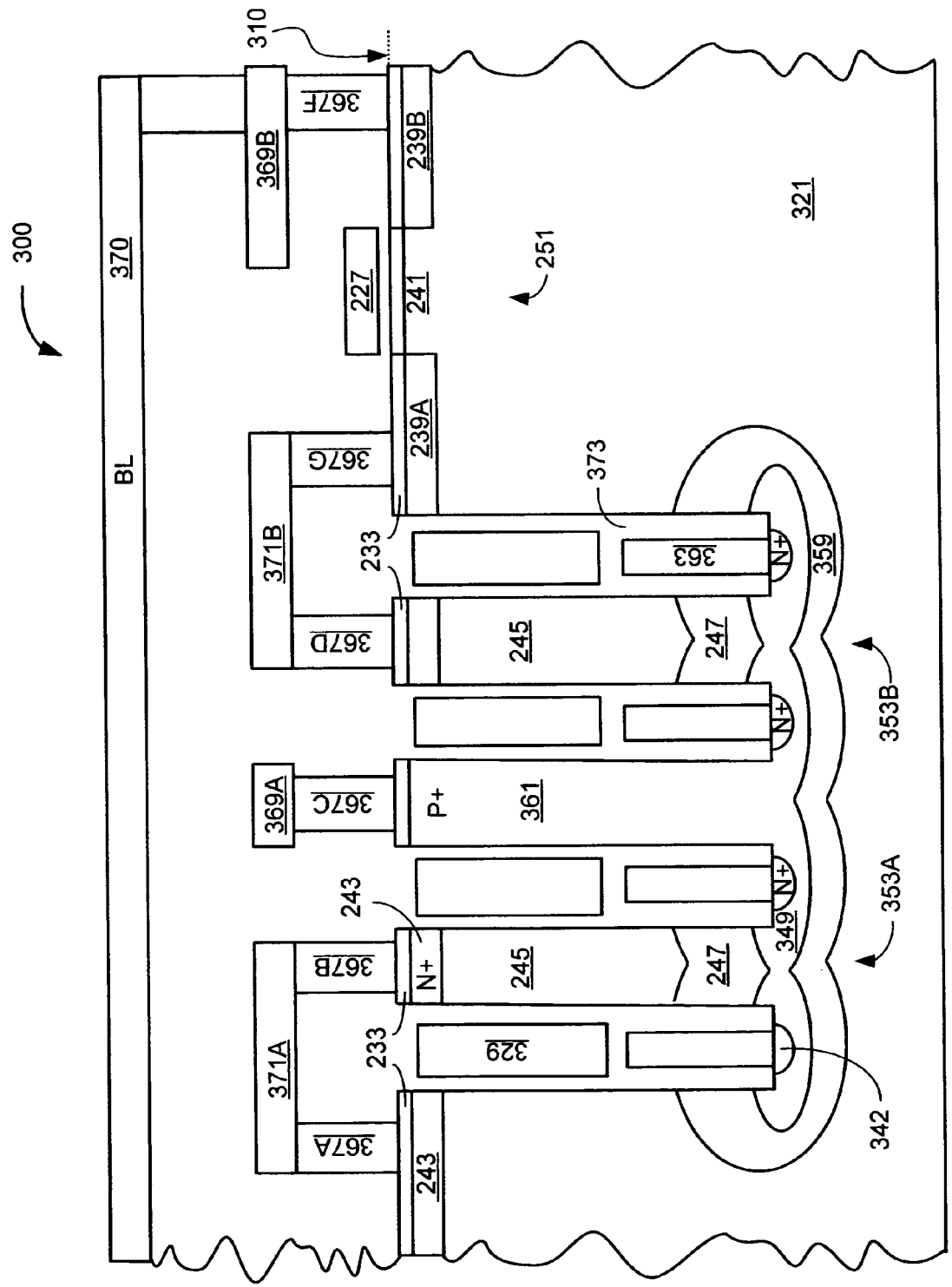
FIG. 3 is a simplified cross-sectional view of a portion of a semiconductor device, as may be associated with certain embodiments of the present invention, showing a portion of a thyristor-based memory having a vertically-aligned regions to a thyristor device formed in silicon germanium and a MOSFET defined at least partly in strained silicon over silicon germanium.

Referencing FIG. 3, at least a portion of a thyristor-based memory device 300 may comprise a p-substrate 321 extending laterally along a plane 310. Vertically oriented (e.g., with respect to the plane 310) thyristors 353A, 353B may be formed in the bulk regions of substrate 321 primarily beneath the strained silicon 233. The device 300 may further comprise access device 251 (e.g., a MOSFET) comprising source and drain regions 239A, 239B, body region 241, and a gate 227 capacitively coupled to body region 241. The body region to the access device may incorporate at least a portion of the strained silicon layer 233. Thyristor 353B, may be electrically coupled to the access device 251 via contacts 367 F, 367G and interconnect 371B. Contacts 367A-367H may electrically couple a semiconductor region to upper layer metallizations 370.

Thyristors 353A, 353B in the pillar structures may comprise common anode-emitter regions 349. During operation of, e.g., thyristor 353A, minority carriers (e.g., electrons) may be injected from an n-base region 247 into the common anode-emitter region 349. The carriers might then migrate to second thyristor 353B and cause thyristor 353B to incorrectly transition from an off state (e.g., storing '0') to an on-state (e.g., storing '1'). Thus, the injected minority carriers may cause corruption of data within thyristor-based memory 300.

To guard against this potential corruption mechanism, n-well 359 may serve to absorb the stray minority carriers. In one embodiment, n-well 359 at least partly surrounds anode-emitter 349. Additional minority carrier absorption may be provided by N+ minority carrier isolation regions 342 (buttons) that may extend into the anode-emitter 349 at the bottom of trenches defined between the semiconductor pillars. Conductive filler material 363 may further contact the carrier isolation buttons 349 at the bottom of the trenches. Insulative material 373 may insulate the conductive filler material from sidewalls of the semiconductor pillars. N-well 359 and N+ minority carrier isolation regions 342 may function similarly to a collector of a bipolar transistor and collect residual minority carriers, thus, protecting corruption of neighboring thyristors 353B. See generally, "Novel Minority Carrier Isolation Device," U.S. patent application Ser. No. 10/671,201; filed Sep. 25, 2003, the disclosure of which is hereby incorporated by reference.

Figure 4:
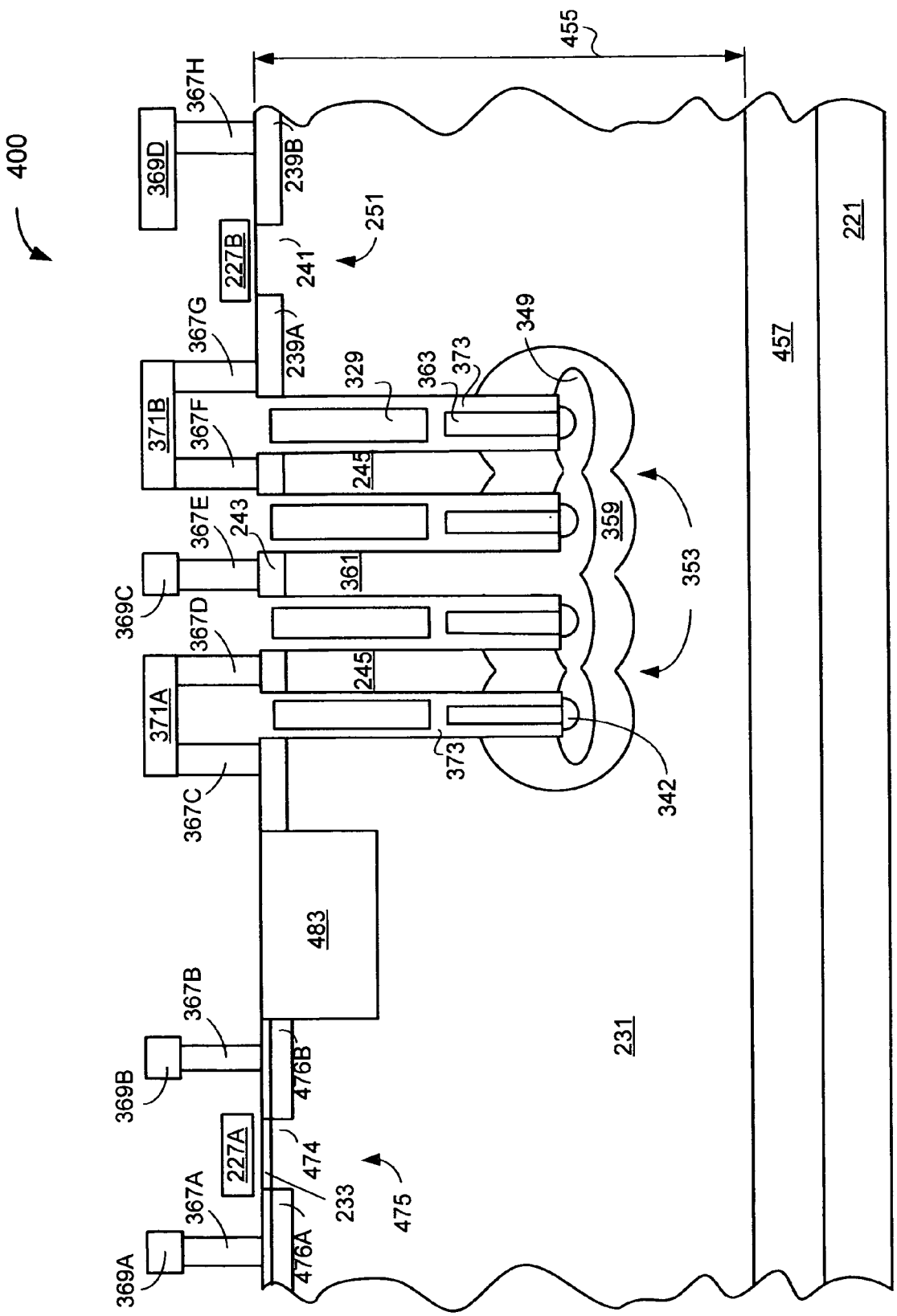
FIG. 4 is a simplified cross-sectional view of a portion of a thyristor-based memory, as may be associated with certain embodiments of the present invention, showing buried thyristors of vertically-aligned embodiments together with other peripheral circuits in strained silicon outside the region of the thyristor-based memory device.

Referencing FIG. 4, semiconductor device 400 may comprise relaxed silicon germanium 231 of substantial depth 455 and a region of strained silicon 233 formed on silicon germanium 231. The relaxed silicon germanium may be disposed over and contiguous with a layer of graded silicon germanium 457. At the boundary region between the relaxed and graded silicon germanium, the percentage of germanium in graded silicon germanium 457 may be substantially the same as that in relaxed silicon germanium 231. Beyond the boundary, the percentage of germanium atoms in the graded silicon germanium may decrease with increased depth. In some further embodiments, the graded silicon germanium layer 457 may be disposed on and contiguous with bulk silicon 221.

Further referencing FIG. 4, relaxed silicon germanium 231 may be used to define pillars with aligned dopant regions defining thyristors 353. These thyristors may be described as vertically aligned with respect to a plane 310 defined by an outwardly-facing surface of the relaxed silicon germanium 231. Capacitor electrodes 329 may be disposed on either side of the individual thyristors 353 and defined by conductive material between insulator material 373 and sidewall spacers. The relaxed silicon germanium 231 may further comprise a pillar 361 to pass a supply reference voltage 361 to anode-emitter region 349, which may be shared in common to respective anode-emitter regions of multiple thyristors 353. (This supply pillar 361 may not be shown in some of the subsequently described embodiments.) Again, in an embodiment, anode-emitter region 349 may be surrounded, at least in part, by buried n-well 359. A thyristor 353 may be electrically coupled in series with an access device 251 which may be defined at least partly in regions of relaxed silicon germanium 231. The access device 251, in an embodiment, may comprise source/drain 239A (which may be in common with cathode-emitter region 243 of the thyristor 253), p-body 241, and drain/source 239B regions. These access device 251 and thyristors 353 may collectively form a portion of a memory device.

In a further aspect of this embodiment, a sequential logic, including in part MOSFET 475, may be formed in a region of the silicon germanium separate from the thyristor-based memory. In one such embodiment, MOSFET 475 may comprise source and drain regions 476A, 476B and body region 474 therebetween. Gate electrode 227A may be capacitively coupled to body region 474 through a gate dielectric and may be operable under bias to induce an inverted channel (not shown) in body region 474. Strained silicon may be formed in the regions separate from the thyristor-based memory and at locations thereof to enable the channels to be effected at least in part within the strained silicon.

In further embodiments, continuing with reference to FIG. 4, isolation region 483 may be disposed between regions of strained silicon such as for logic devices 475 to combinational logic, while other regions of the substrate absent strained silicon may be dedicated to thyristor-based memory. In this embodiment, a portion of the strained silicon region may be incorporated for inverted channel region of the p-body 474 to MOSFET 475, and other regions absent strained silicon used for other devices, e.g., thyristors 353 and access transistor 251. Thus, the devices that comprise strained silicon 233 may be electrically isolated from devices that do not comprise strained silicon (e.g., thyristors 353 and access transistor 251). In a particular embodiment, the isolation may comprise a shallow trench isolation structure. In another embodiment, the isolation region 483 may be formed with oxide spacers, and/or other types of isolation material.

Continuing with this embodiment, the depth 455 of relaxed silicon germanium 231 may be greater than the height required for the thyristor devices. Thus, the doped regions for the thyristors may be formed within depth 455 of the silicon germanium. Additionally, the buried n-well 359 may also be kept within the depth of the silicon germanium. It may be further noted for this embodiment that these "buried" devices and regions may be formed entirely in the relaxed silicon germanium 231.

In particular embodiments, thyristors 353 may be formed prior to the formation of the strained silicon 233 in the areas for the channel region to p-body 474. Because of a high-temperature that may be required during anneal of the buried devices; the buried devices may be formed before formation of the strained silicon region 233. It may be noted that the strain in the silicon can be preserved by protecting it from the exposure to the potentially harmful high temperatures that could otherwise be present during the formation of thyristors.

Although the semiconductor device described with reference to FIG. 4 comprises strained silicon 233 for at least a portion of the inversion channel of p-body 474 for transistor 475 of, for example, a peripheral device; an alternative embodiment may also comprise strained silicon 233 channel regions to body 241 of access transistors 251 (FIG. 3).

Figure 5:
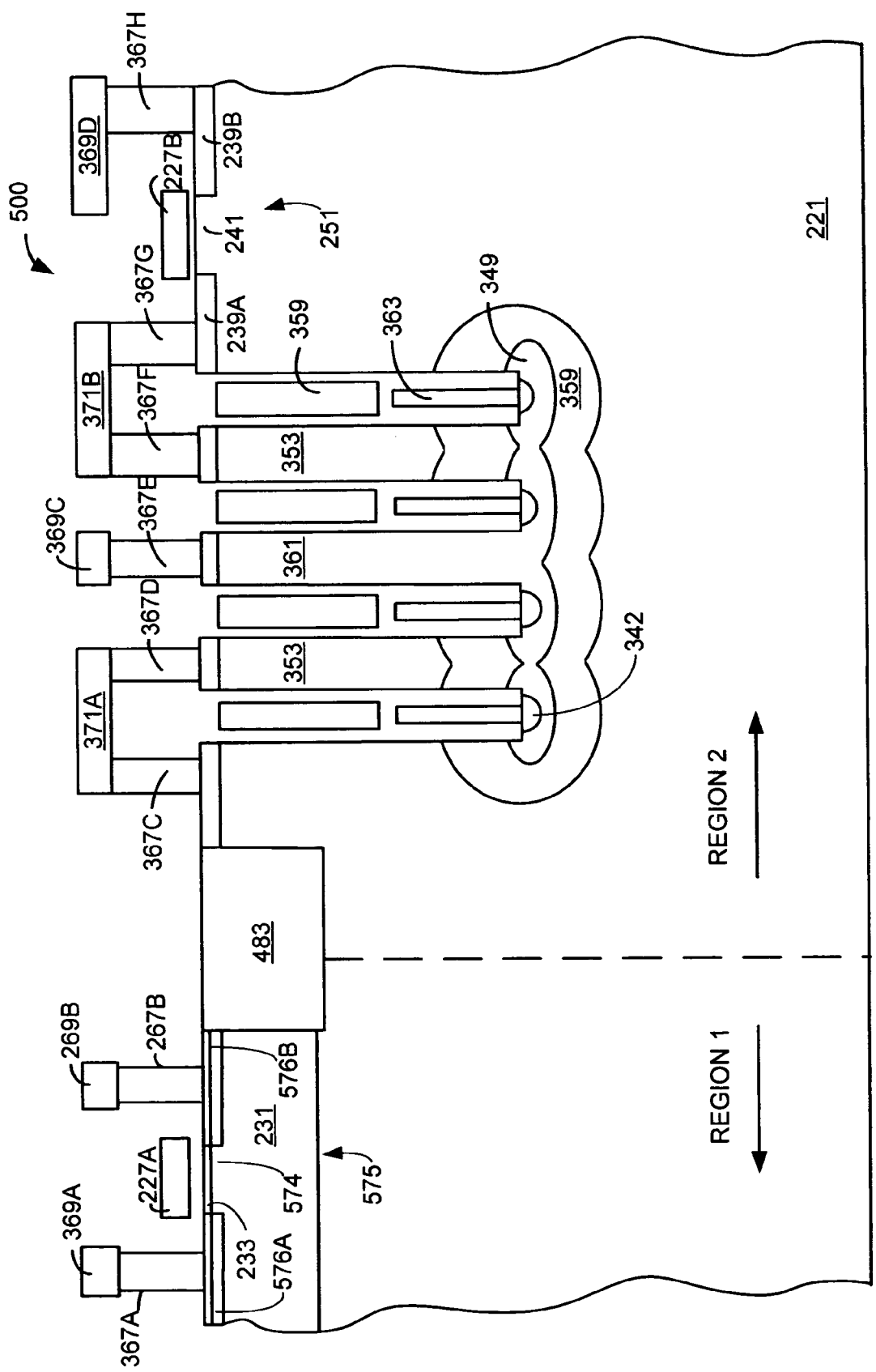
FIG. 5 is a simplified cross-sectional view of a semiconductor device, as may be associated with certain embodiments of the present invention, showing a thyristor and an access device of a thyristor-based memory formed in bulk silicon and a MOSFET of other combinational logic formed in an island of strained silicon outside the region of relaxed silicon and separated there from by a shallow isolation trench.

Referencing FIG. 5, semiconductor device 500 may comprise a metal on silicon field effect transistor ("MOSFET") 575 formed at least partly in strained silicon 233. The strained silicon region may assist operation of an inversion channel in body region 574. In a particular embodiment, MOSFET 575 may form part of combinational logic while the other devices, such as the thyristor-based memory, may be formed at least partly in relaxed bulk silicon 221. Thus, semiconductor device 500 may be regarded as having two regions: 1) Region 1 with strained silicon which may comprise the MOSFET 575 and perhaps other combinational logic devices, and 2) Region 2 which may comprise bulk silicon devices (e.g., thyristor-based memory components, high-voltage FETs, and other devices).

Further referencing FIG. 5, Region 2 may be processed to form thyristors 353 and access device 251 for thyristor-based memory. Capacitor electrodes 329 may be capacitively coupled to a base region of thyristors 353. Further, as previously discussed with reference to FIG. 3, minority carrier isolation devices 342 may be disposed at the bottom of the trenches and may provide protection against minority carrier injection into anode-emitter 349 of adjacent thyristors.

In particular embodiments, strained silicon 233 may be selectively disposed in specific regions for the devices that are to incorporate strained silicon 233. In contrast to the embodiments disclosed with reference to FIG. 2, the embodiments disclosed with reference to FIG. 5 may reflect a design decision to incorporate strained silicon 233 into MOSFETs of combinational logic 575 but not to incorporate strained silicon 233 into access device 251 (in this case depicted as a MOSFET) for the thyristor-based memory. The decision to incorporate strained silicon 233 into access device 251 of the thyristor-based memory could be based upon an operating voltage level for the MOSFET, leakage current tolerances, and the like.

Referencing FIGS. 6A-6G, a method of fabricating a semiconductor device, consistent with an embodiment of the present invention, may comprise forming islands (e.g., regions, areas, etc.) of strained silicon over a semiconductor substrate. The ability to form strained silicon selectively dispose over the substrate may allow fabrication of devices designed to incorporate the strained silicon (e.g., those whose performance may benefit from the incorporation of strained silicon) together with others that might not so benefit.

Figure 6A:
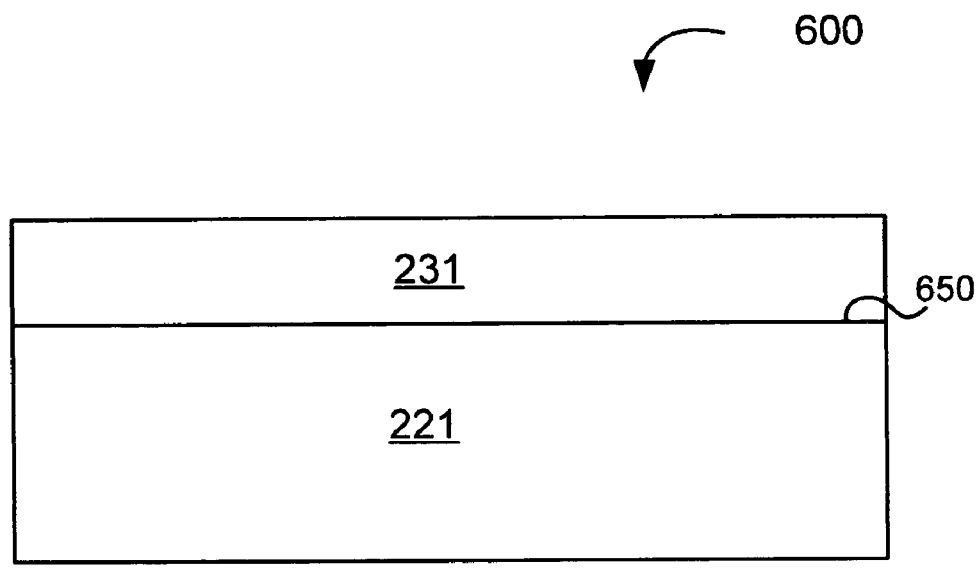
FIG. 6A is a simplified cross-sectional view of a semiconductor device in an early stage of fabrication according to a method of fabrication, showing the formation of a layer of relaxed silicon germanium on a silicon substrate.

Referencing FIG. 6A, a method of fabricating a semiconductor device 600 may comprise forming relaxed silicon germanium 231 on a silicon substrate 221. The silicon germanium may be grown epitaxially (e.g., using heteroepitaxy, psuedomorphic growth, molecular beam epitaxy, ultra-high-vacuum chemical vapor deposition, or the like). Doping may also be accomplished during the growth process. As previously discussed, the relaxed silicon germanium 231 may be formed to comprise approximately 5 percent to 30 percent, or other percentage of germanium atoms.

In some cases, the percentage of germanium may be adjusted to affect a desired carrier mobility. For example, a higher percentage (e.g., 25 percent) of germanium may result in high hole mobility. Generally, however, substantial increases in electron mobility may be available with a lower percentage of germanium (e.g., 10 percent), i.e., lower relative to that for enhancing the hole mobility.

Further referencing FIG. 6A, in a particular embodiment, a layer of graded silicon germanium (not shown) may be formed between the relaxed silicon germanium 231 and the silicon substrate 221. In addition, such embodiment may be described with a boundary region between the graded silicon germanium and the relaxed germanium 231. At this boundary, the graded silicon germanium and the relaxed silicon germanium may comprise substantially similar percentages of germanium. It may be understood that the percentage of germanium within the graded silicon germanium may increase with increasing distance from the boundary and relative to the relaxed silicon germanium. With the enhanced percentage of germanium at the surface 651 thereof opposite the underlying silicon substrate 221, silicon when disposed thereon and of different intrinsic lattice spacing might, therefore, be understood to experience strain (in order to match the lattice spacing of the silicon germanium). By using the graded silicon germanium between the silicon germanium and the supporting silicon substrate 221, strain at the boundary therebetween may be minimized.

In a particular embodiment, the layer of relaxed silicon germanium 231 may be formed with thickness sufficient to allow its natural lattice structure to be restored and to be unaffected by underlying silicon substrate 221. As discussed above with respect to a possible layer of graded silicon germanium, when referring to relaxed silicon germanium 231 over a silicon substrate 221, it may be understood that one or both of the silicon germanium 231 and the silicon 221 may be strained proximate to a boundary defined between them. The strain may decrease with increased distance from the junction. At a sufficient distance from the silicon/silicon germanium junction, the silicon germanium lattice may then be regarded as "relaxed." Therefore, the formation of a layer of relaxed silicon germanium 231 may be understood to comprise forming the relaxed silicon germanium with a thickness sufficient for most of the silicon germanium 231 to be relaxed. In order to avoid unnecessary complexity, in at least some discussions of the layer of relaxed silicon germanium 231, the relatively small portion of graded silicon germanium, therefor, may be disregarded and the layer may simply be referred to as comprising relaxed silicon germanium 531.

For some embodiments, some of the elements (e.g., thyristor, access transistor, etc.) may be formed in regions of the relaxed material rather than in the graded portion of the silicon germanium layer. The relaxed silicon germanium 231, therefore, may then be formed with thickness sufficient to allow the formation of devices within the relaxed portion. In a particular embodiment, such as that discussed with reference to FIG. 4, vertically aligned (with respect to the layer of silicon germanium 231) pillars of semiconductor material may define thyristors or other devices and may be formed within the depth of the relaxed silicon germanium 231.

Figure 6B:
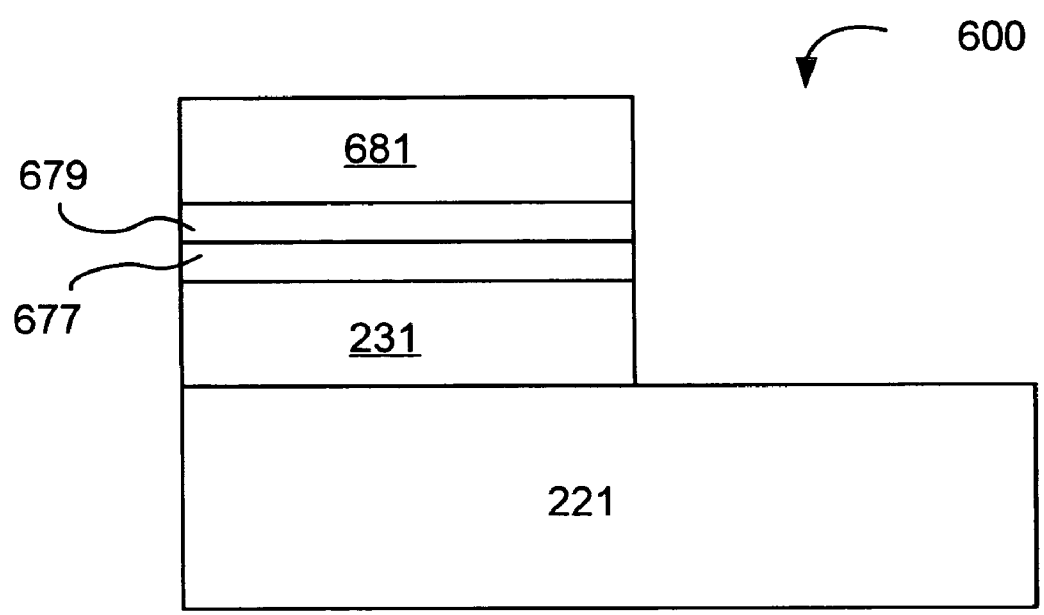
FIG. 6B is a simplified cross-sectional view of the semiconductor device of FIG. 6A in another stage of fabrication according to a method of fabricating the semiconductor device for an embodiment, showing the deposition of oxide and nitride and mask patterning by which to etch the oxide, nitride and silicon germanium to form sidewalls and to expose select regions of the silicon.

Referencing FIG. 6B, oxide 677 and then nitride 679 may be formed (e.g., deposited) over the relaxed silicon germanium 231. Photoresist 681 may be patterned thereover to define protected regions of nitride 679 and exposed regions that are to be etched. The exposed regions of nitride 679, oxide 677 and relaxed silicon germanium 231 thereunder may then be etched until exposing regions of silicon substrate 221.

Figure 6C:
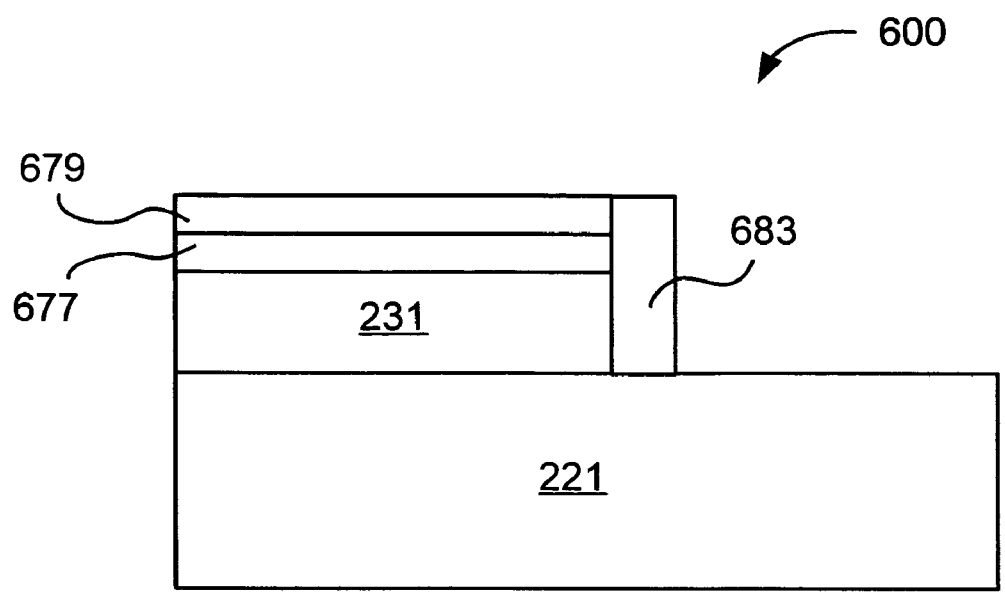
FIG. 6C is a simplified cross-sectional view of the semiconductor device of FIG. 6A in another stage of fabrication according to a method of fabricating a semiconductor device for an embodiment, showing formation of spacers against sidewalls of the oxide, nitride and silicon germanium, e.g., by the deposition of oxide and an anisotropic etch to form the oxide spacer against the sidewalls.

Referencing FIG. 6C, the photoresist 681 may be stripped, and oxide may be formed conformally (e.g., deposited) on the exposed regions including silicon substrate 221. An anisotropic etch may then be performed to form oxide spacer 683 against the sidewalls defined by the etched nitride 679, oxide 677 and silicon germanium 231. The oxide spacer 683 may be understood to be horizontally aligned with and disposed against the sidewall of relaxed silicon germanium 231.

Figure 6D:
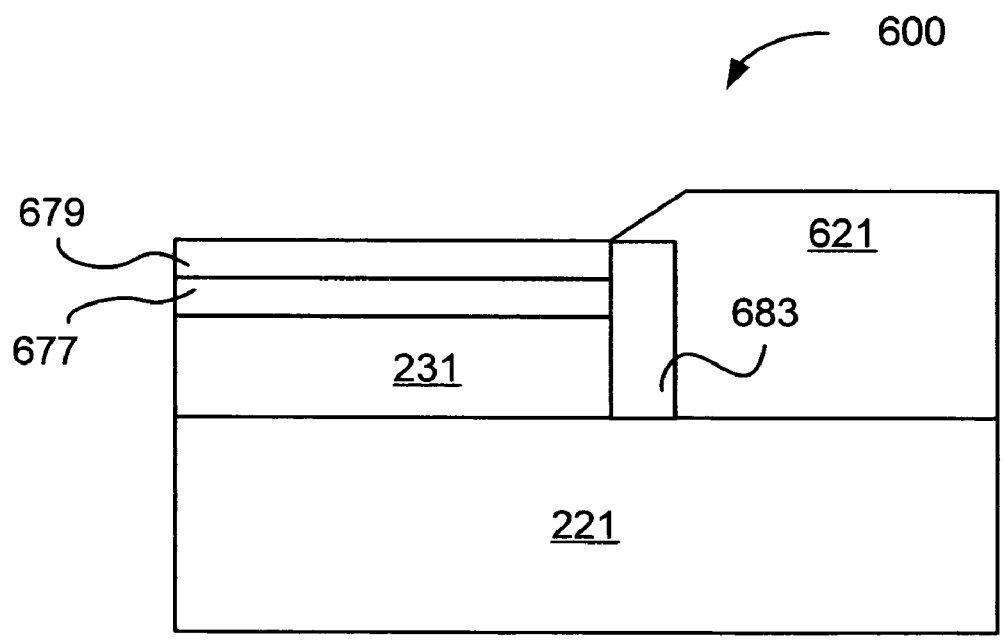
FIG. 6D is a simplified cross-sectional view of the semiconductor device of FIG. 6A in another stage of fabrication according to a method of fabricating a semiconductor device for an embodiment, showing selective epitaxial silicon deposition over the exposed silicon of the substrate.

Referencing FIG. 6D, silicon 621 may be selectively and epitaxially deposited over exposed regions of silicon substrate 221. The relaxed silicon 621 and the silicon substrate 221 may be understood to be substantially similar (i.e., chemically and structurally) structure, but may be referred to separately for ease of understanding certain features of this embodiment.

Figure 6E:
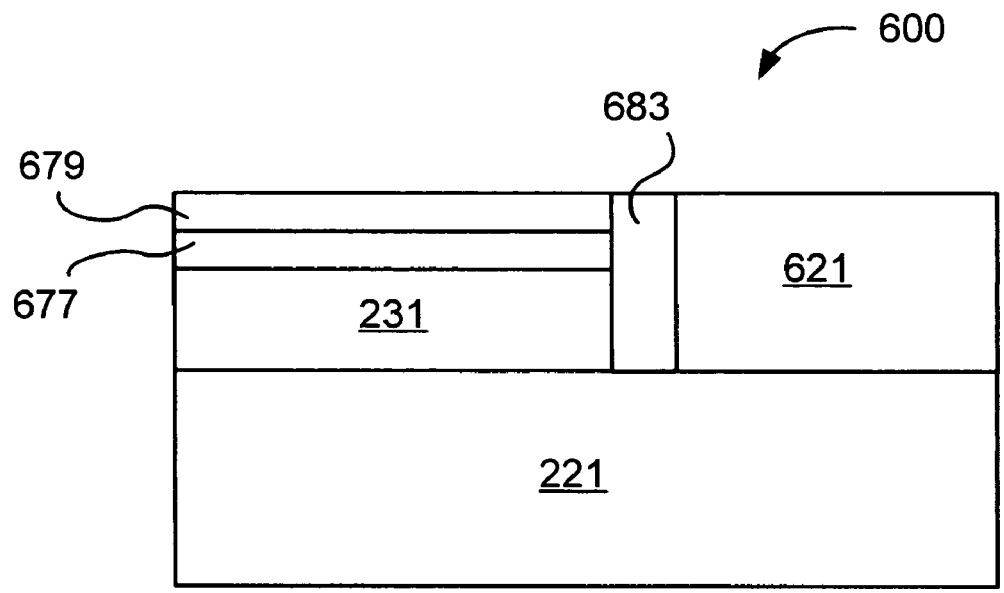
FIG. 6E is a simplified cross-sectional view of the semiconductor device of FIG. 6A in another stage of fabrication, according to a method of fabricating a semiconductor device for an embodiment, showing planarization of the deposited silicon.

Referencing FIG. 6E, planarization (e.g., chemical mechanical polishing) may be performed to form a substantially planar surface across nitride 679, oxide spacer 683 and relaxed silicon 621.

Figure 6F:
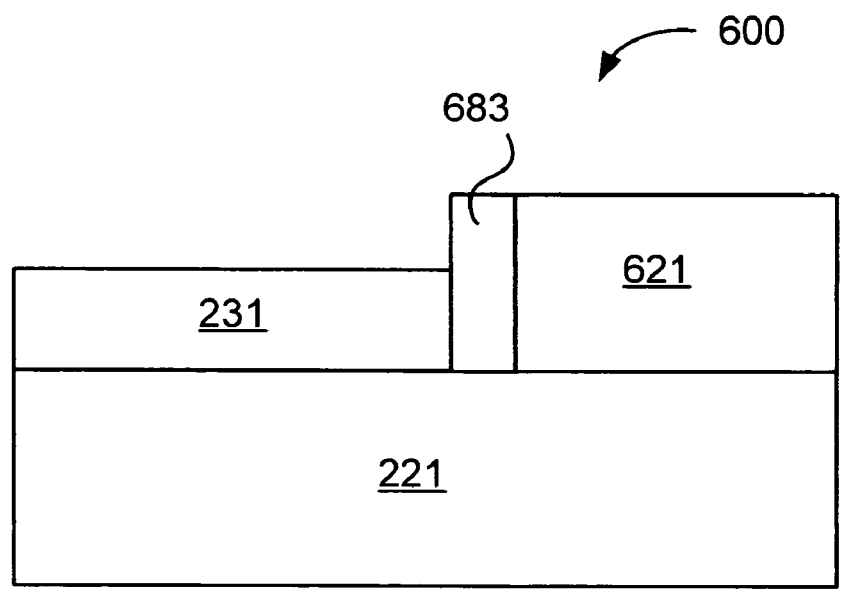
FIG. 6F is a simplified cross-sectional view of the semiconductor device of FIG. 6A in another stage of fabrication according to a method of fabricating a semiconductor device for an embodiment, showing removal of oxide and nitride sacrificial layers to expose silicon germanium.

Moving forward with reference to FIG. 6F, nitride 679 and oxide 677 may be removed to expose an outwardly-facing relaxed region of silicon germanium 231. The removal may be accomplished by, for example, anisotropic etching (e.g., selective anisotropic etching).

Figure 6G:
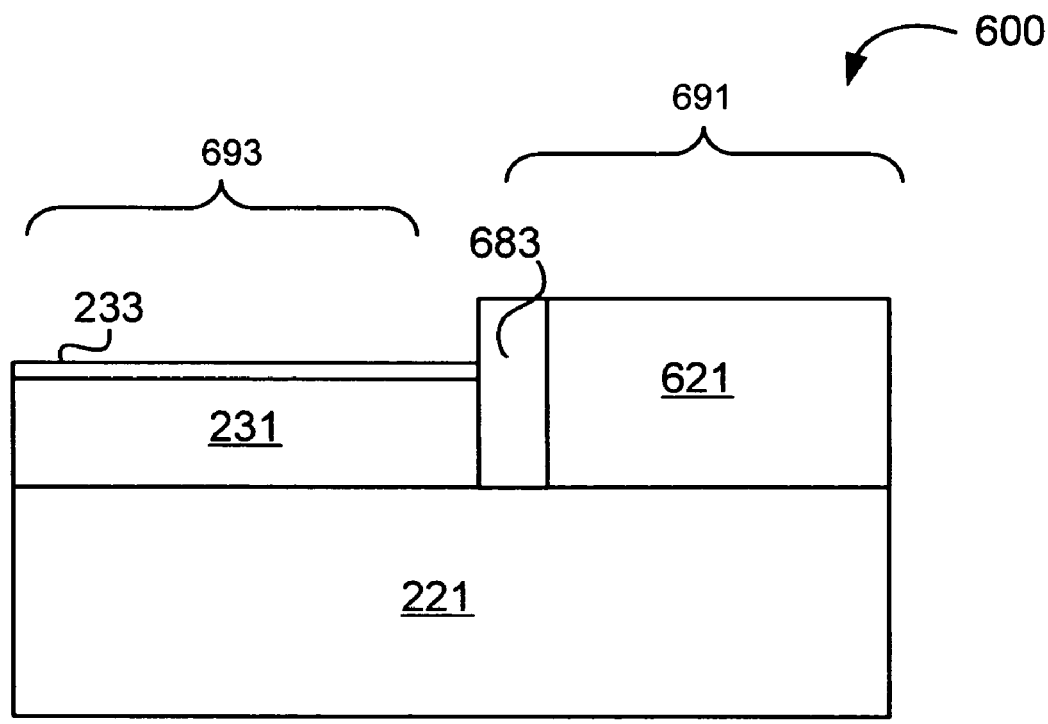
FIG. 6G is a simplified cross-sectional view of the semiconductor device of FIG. 6A in another stage of fabrication according to a method of fabricating a semiconductor device for an embodiment, showing deposition of strained silicon over exposed regions of relaxed silicon germanium.

Referencing FIG. 6G, a thin layer (e.g., 20 nanometers) of strained silicon 233 may then be formed over the relaxed silicon germanium 231. In a particular embodiment, the strained silicon 233 may be formed by epitaxial deposition (e.g., using heteroepitaxy, psuedomorphic growth, molecular beam epitaxy, ultrahigh-vacuum chemical vapor deposition, and the like) over the exposed surface of relaxed silicon germanium 531. In a further embodiment, the thin layer of silicon may be formed by a series of individual depositions of sublayers of silicon. Doping may also be performed, in situ, during the epitaxial growth of the strained silicon layer. When the silicon is deposited on the silicon germanium region, the silicon is strained as a result of the silicon matching the silicon germanium lattice below. The silicon deposited on the silicon surface forms relaxed silicon since it matches the relaxed silicon lattice below it.

By this method, as described with reference to FIGS. 6A-6G, therefore, an island of strained silicon 693 may be formed neighboring an island of relaxed silicon 691 and oxide spacer 683 may be disposed between them to serve as an isolation structure between the boundaries of the relaxed and stressed silicon regions. In this embodiment, the island of strained silicon 693 may comprise a thin layer of silicon 233 on (e.g., on the surface of) the silicon germanium. In a further embodiment, the relaxed silicon 621 and the oxide spacer 683 may be first planarized for a surface more planar to that for the strained silicon 233.

Referencing FIGS. 7A-7G, another method of fabricating a semiconductor device with islands of strained silicon and islands of relaxed silicon, consistent with an embodiment of the present invention, may comprise etching and/or formation of shallow isolation trenches between regions of strained silicon and regions of relaxed silicon.

Figure 7A:
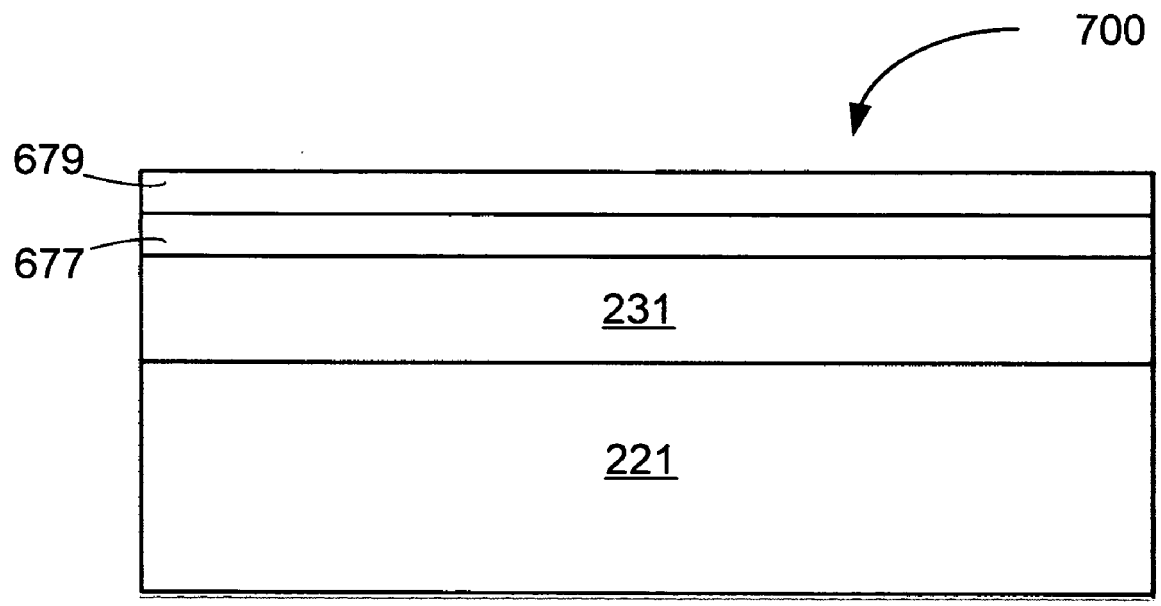
FIG. 7A is a simplified cross-sectional view of the semiconductor device in an early stage of fabrication according to a method of fabricating a semiconductor device for an embodiment of the present invention, showing the formation of relaxed silicon germanium, oxide and nitride, respectively, over a silicon substrate.

Referencing FIG. 7A, relaxed silicon germanium 231 may be formed (e.g., deposited, grown) over silicon substrate 221. Oxide 677 and nitride 679 may be deposited respectively over the silicon substrate 221.

Figure 7B:
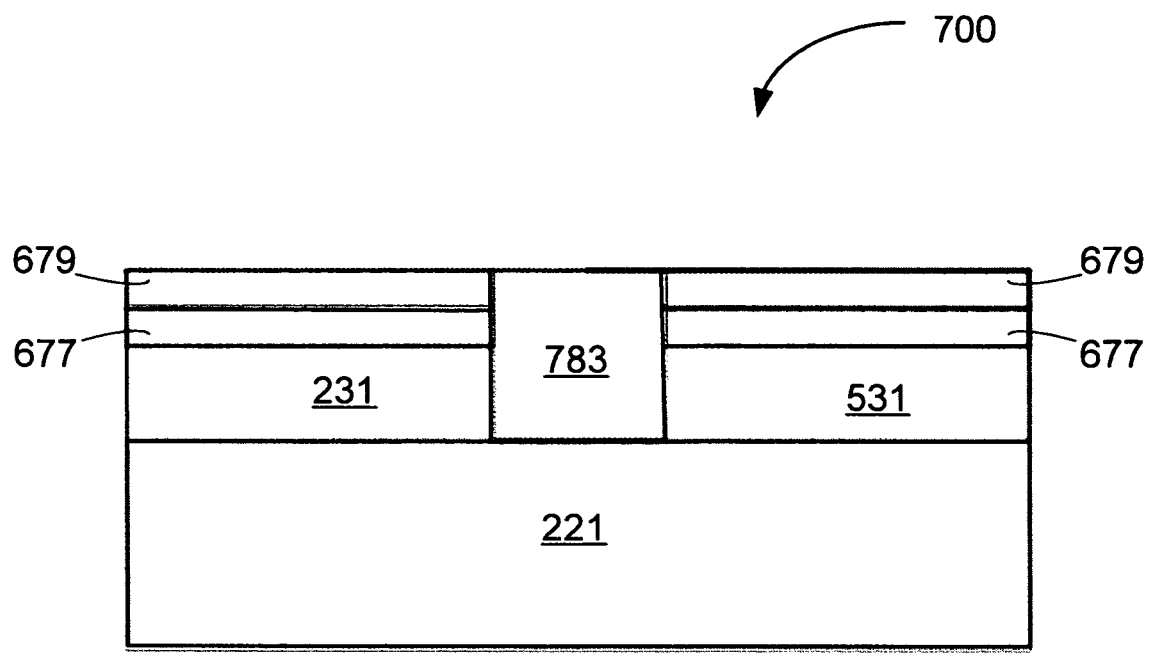
FIG. 7B is a simplified cross-sectional view of the semiconductor device of FIG. 7A in another stage of fabrication according to a method of fabricating a semiconductor device for an embodiment, showing the formation of a shallow isolation trench.

Referencing FIG. 7B, photoresist (not shown) may be patterned to define a window through which a trench may be formed. Material exposed by the window may then be etched to form sidewalls that define a trench. Dielectric may then be deposited within the trench to form the shallow isolation trench 783.

Figure 7C:
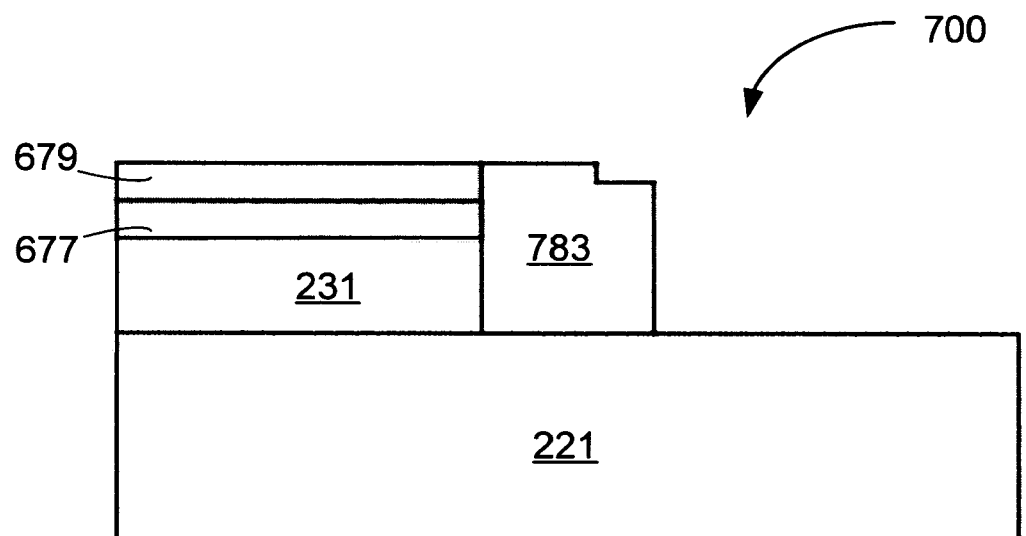
FIG. 7C is a simplified cross-sectional view of the semiconductor device of FIG. 7A in another stage of fabrication according to a method of fabricating a semiconductor device for an embodiment, showing selective (e.g., photolithographic patterning) removal of select regions of the nitride, oxide and silicon germanium.

After forming the shallow isolation trench 783, moving forward with reference to FIG. 7C, photoresist may be patterned to define a window therethrough and expose regions of the nitride 679, oxide 677 and silicon germanium 231 that may be selectively removed. As shown in FIG. 7C, a portion of the oxide spacer 783 may be impacted as a result of the photoresist misalignment to the regions where the nitride, oxide and silicon germanium are to be removed. In a particular embodiment, the nitride, oxide and silicon germanium may be removed by an anisotropic etch until reaching the upwardly facing surface of silicon substrate 221. After performing this selective anisotropic etch, the photoresist mask may be removed.

Figure 7D:
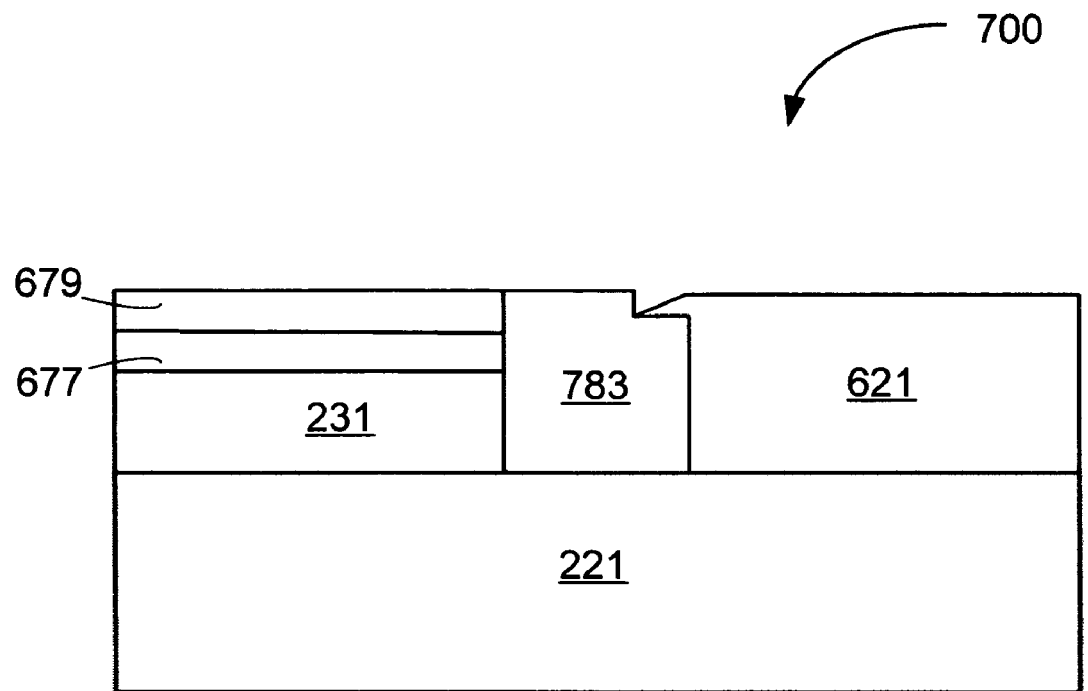
FIG. 7D is a simplified cross-sectional view of the semiconductor device of FIG. 7A in another stage of fabrication according to a method of fabricating a semiconductor device for an embodiment, showing selective epitaxial deposition of silicon (i.e., relaxed) over exposed silicon.
Figure 7E:
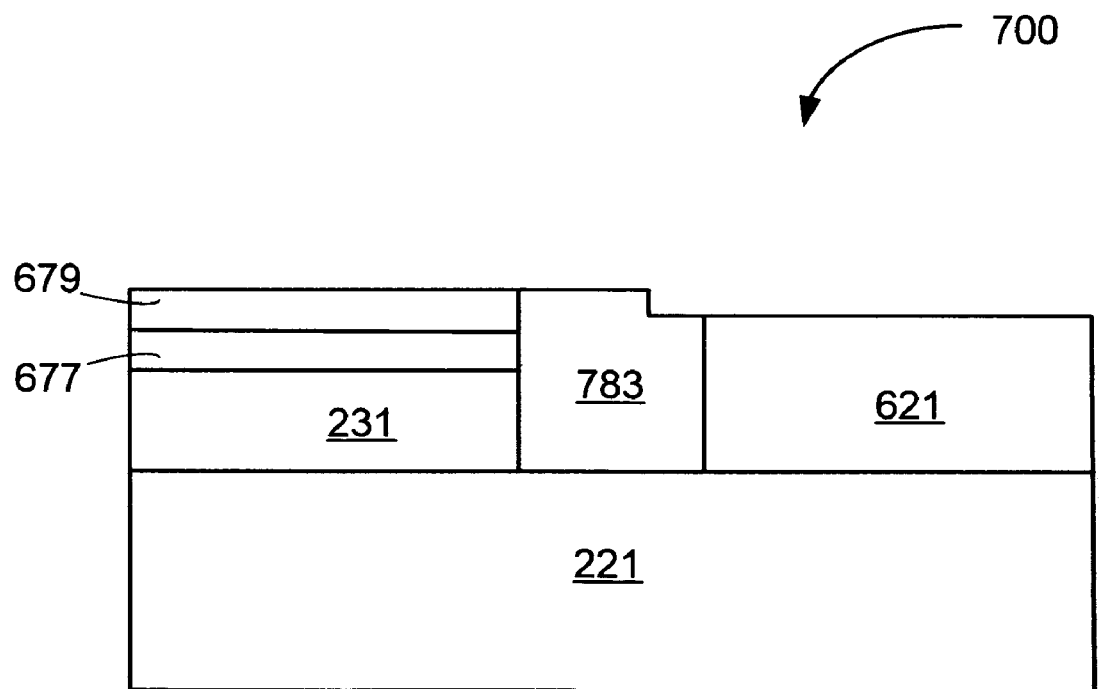
FIG. 7E is a simplified cross-sectional view of the semiconductor device of FIG. 7A in another stage of fabrication according to a method of fabricating a semiconductor device for an embodiment, showing planarization or etching of silicon that may remove silicon from over the shallow isolation trench.

After removing the photoresist, now referencing FIG. 7D, silicon may be epitaxially deposited over exposed regions of the relaxed silicon 221. The epitaxially deposited silicon may be grown until reaching an elevation substantially corresponding to that of the upwardly-facing surface of nitride 679. In the event the epitaxial growth of silicon 621 overlaps a portion of the shallow isolation trench 783, referencing FIGS. 7D and 7E, a quick chemical-mechanical polish or etch may be performed for removing portions of the silicon 621 that overlap the dielectric (e.g., oxide) of the shallow isolation trench. In one embodiment, the removal of the overlapping silicon may be accomplished by a brief selective etch of silicon relative to dielectric of the oxide and nitride 783, 679, respectively. In a further embodiment, the removal may be performed by chemical-mechanical polishing. In other alternative embodiments, the portion of silicon that may overlap the dielectric of the isolation trench 783 may be left intact.

In accordance with some optional embodiments, bulk devices, e.g., thyristors, high power FET's for which strained silicon is not of real benefit, such bulk devices may be formed in regions of the relaxed silicon 621. Forming these devices prior to the formation of strained silicon (as described subsequently herein) may have the advantage of allowing high annealing temperatures during the formation of the bulk devices without risk of damaging strained silicon, which may be formed subsequently and which base silicon germanium thereunder might not otherwise be capable of tolerating temperatures associated with fabrication of the bulk devices.

Figure 7F:
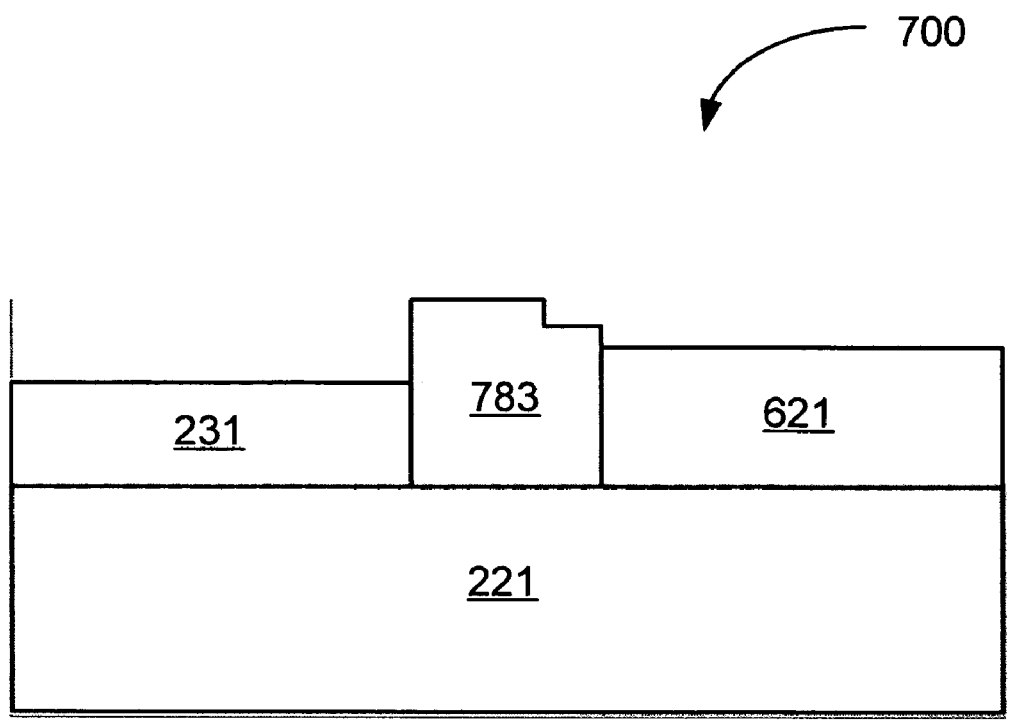
FIG. 7F is a simplified cross-sectional view of the semiconductor device of FIG. 7A in another stage of fabrication according to a method of fabricating a semiconductor device for an embodiment, showing further removal of the masking nitride and oxide sacrificial layers so as to expose regions of relaxed silicon germanium.
Figure 7G:
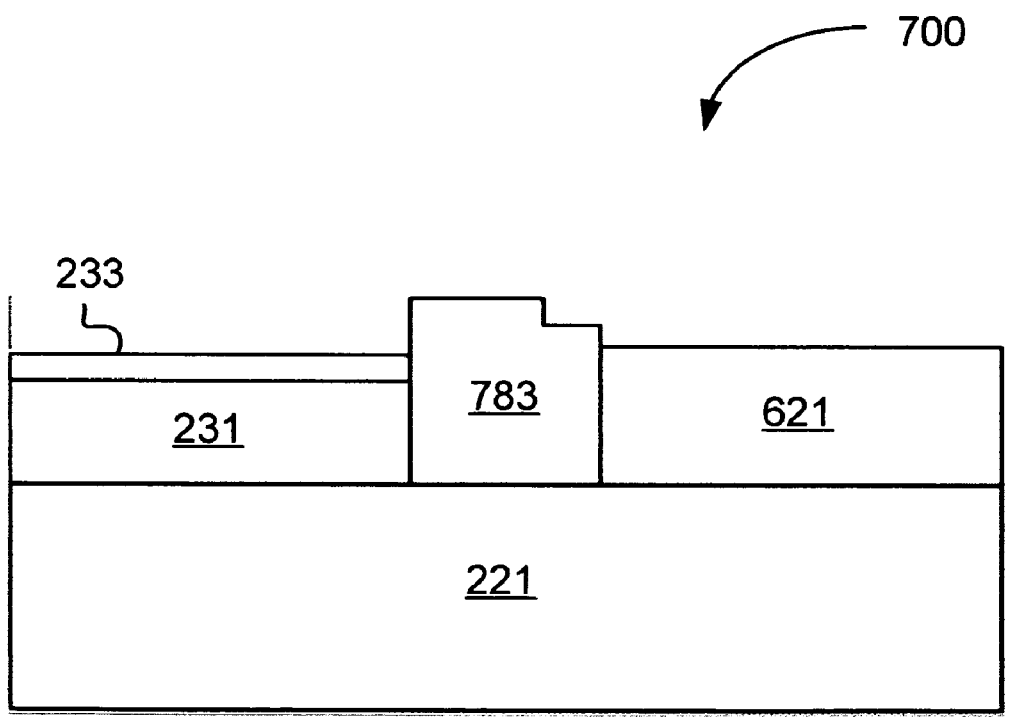
FIG. 7G is a simplified cross-sectional view of the semiconductor device of FIG. 7A in another stage of fabrication according to a method of fabricating a semiconductor device for an embodiment, showing deposition of silicon and formation of strained silicon over the exposed regions of silicon germanium.

After forming the relaxed silicon, moving forward with reference to FIG. 7F, the nitride and oxide layers may be removed from the relaxed silicon germanium 231. Next, silicon 233 may be formed epitaxially over the exposed relaxed silicon germanium 231, to define one or more islands of strained silicon 693. Devices designed to incorporate strained silicon (e.g., some MOSFETs, logic devices, etc.) may then be formed in the islands 693 of strained silicon.

With reference to FIGS. 8A-8I, a method of fabricating a semiconductor device consistent with another embodiment of the present invention may comprise forming islands of strained silicon amongst other regions of relaxed silicon as a part of a silicon-on-insulator (SOI) type structure. Similarly as discussed previously, typically, a high percentage of germanium in the silicon germanium may lend enhanced strain to strained silicon structures. But some high percentages of germanium may compromise allowable anneal temperatures. By this particular embodiment, however, silicon germanium of a high percentage of germanium may be incorporated with SOI structures for enabling collective benefits of both high strain and SOI.

Figure 8A:
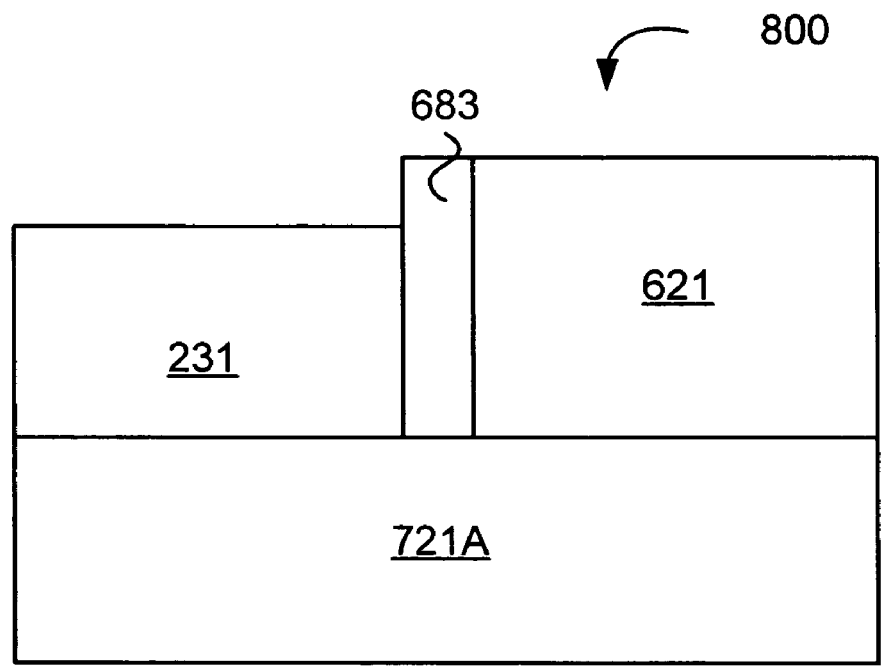
FIG. 8A is a simplified cross-sectional view of a semiconductor device, in a stage of fabrication according to a method of fabricating a semiconductor device consistent with an embodiment of the present invention, showing the formation of silicon germanium and relaxed silicon with an with an isolation trench (e.g., with oxide) disposed between the silicon germanium and relaxed silicon.

Referencing FIG. 8A, a method of fabricating a semiconductor device 800 may comprise forming islands of relaxed silicon germanium 231 and relaxed silicon 621 over first silicon substrate 721A. Additionally, an isolation structure 683 (e.g., an oxide spacer) may be formed between the regions of silicon germanium 231 and silicon 621. The formation of these structures may be performed similarly to the methods described previously with reference to FIGS. 6A-6F.

Figure 8B:
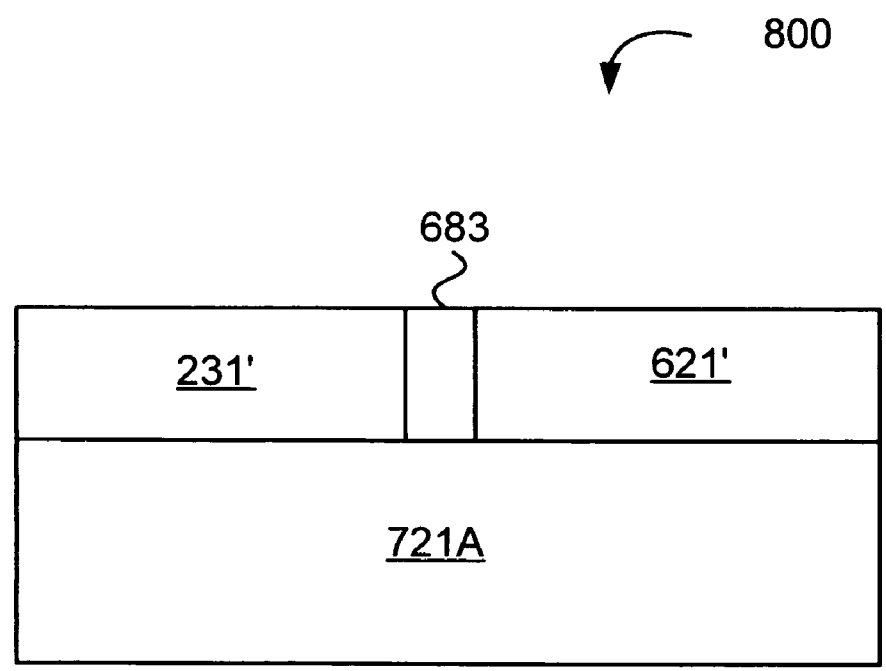
FIG. 8B is a simplified cross-sectional view of the semiconductor device of FIG. 8A in another stage of fabrication according to a method of fabricating a semiconductor device for an embodiment, following planarization of the silicon germanium, oxide and silicon.

Referencing FIG. 8B, planarization (e.g., using chemical mechanical polishing or other planarization process) may flatten the upper surfaces of the relaxed silicon germanium 231, relaxed silicon 621 and the intermediate isolation dielectric 683.

Figure 8C:
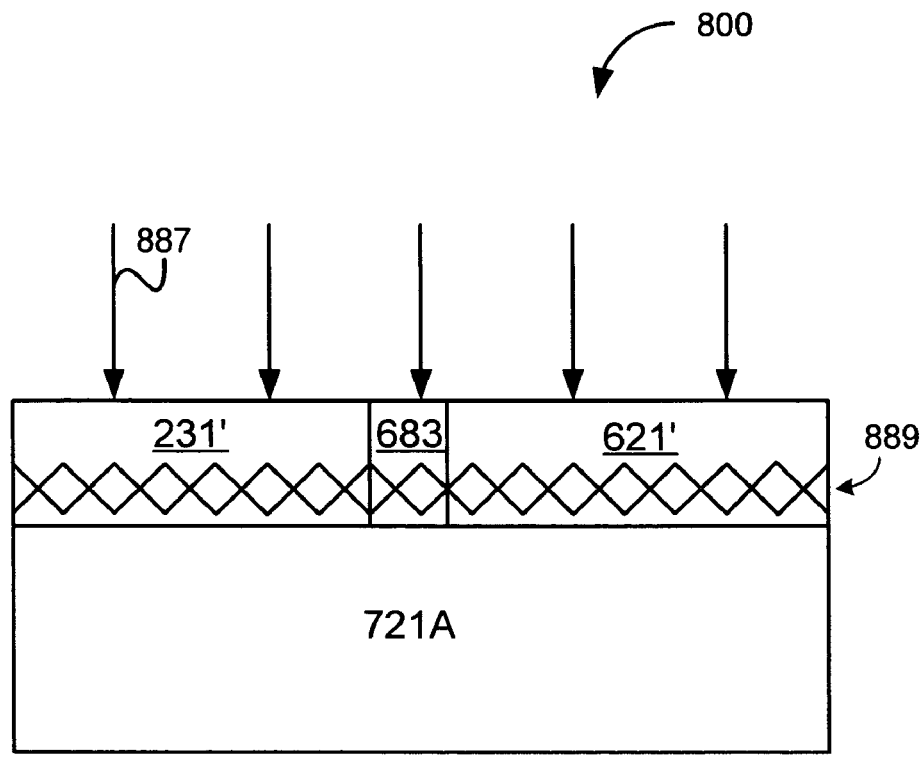
FIG. 8C is a simplified cross-sectional view of the semiconductor device of FIG. 8A in another stage of fabrication according to a method of fabricating a semiconductor device for an embodiment, showing formation of a break-plane by implant of hydrogen into subsurface regions of the silicon germanium, silicon and oxide.

After planarizing the upper surfaces, moving forward with reference to FIG. 8C, hydrogen 887 may be implanted and buried into a subsurface elevation across the wafer. The buried or implanted hydrogen may be understood to establish a separation plane by which a surface layer across the wafer or substrate may be subsequently separated. In this embodiment, the thin surface layer may be defined by the depth of the hydrogen implants across all regions of the wafer—i.e., including the regions of silicon germanium 231, relaxed silicon 621 and oxide spacer 683. In a particular embodiment, the energy used for the hydrogen implant may be selected for placing the highest concentration of implant hydrogen 889 (depth of the buried hydrogen) at an elevation just above the upper surface of original silicon substrate 721A. Thus, the energy selection may be described for some embodiments as being dependent on the desired thickness for the layer to be transferred.

Figure 8D:
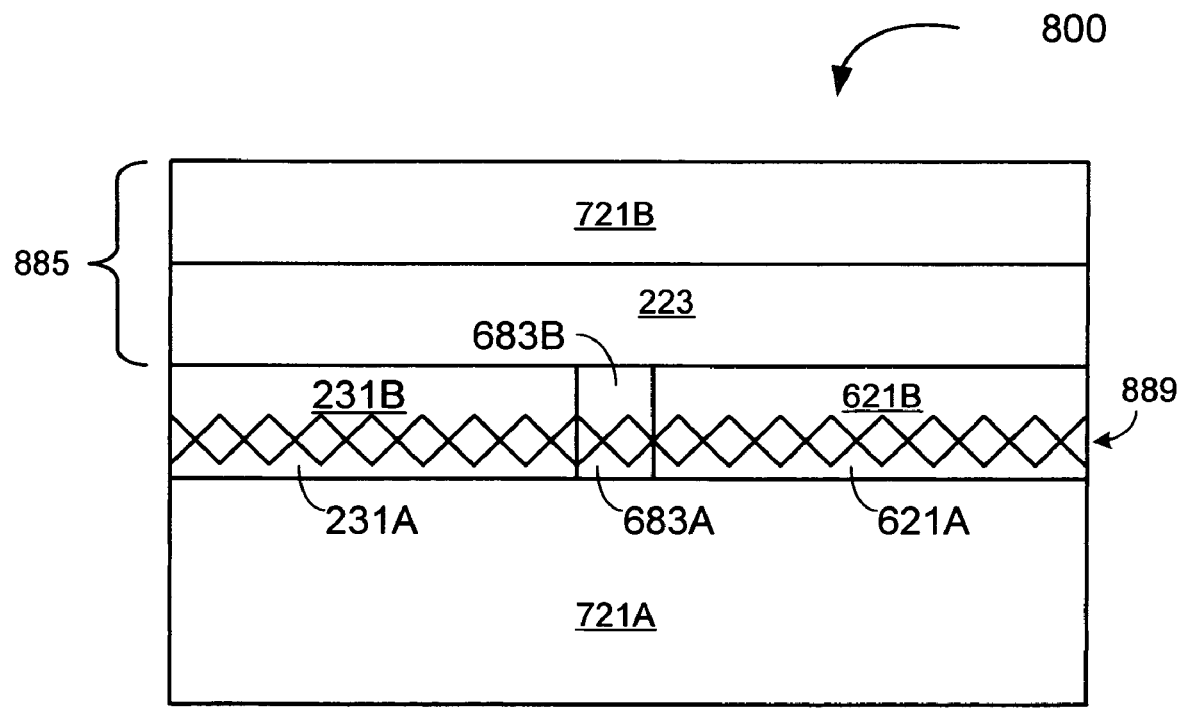
FIG. 8D is a simplified cross-sectional view of the semiconductor device of FIG. 8A in another stage of fabrication according to a method of fabricating a semiconductor device for an embodiment, showing placement and bonding of a handling wafer to the surface of the first wafer of silicon germanium, silicon and the spacer regions, which may include bonding to an oxide of the handling wafer.

Next, referencing FIG. 8D, a bonding or handling wafer 885 such as second silicon substrate 721B with a layer of oxide 223, e.g., of less than 500 nanometers, may be bonded (e.g., by a bonding process with anneal) to the upper outwardly-facing surface presented by relaxed silicon germanium 231, isolation dielectric 683 and relaxed silicon 621.

To facilitate bonding, the surfaces to be joined previously may have been planarized or polished (e.g., using a planarization process such as by chemical mechanical planarization) to achieve a surface deviation or roughness, e.g., of less than about 10 nanometers root mean squared (rms).

After mating the surfaces, the materials may be annealed in a given atmosphere, e.g., of $N_2$. At the contacting surfaces, covalent bonding may join oxide 223 of the handling wafer 885 to the contacted surfaces of silicon germanium 231, silicon 621 and intermediate dielectric 683. In one embodiment, the annealing process may be performed at a temperature and for a length of time sufficient to facilitate bonding; but within a thermal budget that avoids activating the embedded hydrogen ions 889. In one such embodiment, e.g., the bonding anneal may use a temperature of between 250 and 350 degrees Celsius for a duration of about 20 to 30 minutes—substantially below the melting point of silicon germanium 231 of a given percentage of germanium.

Further referencing FIG. 8D, the bonded substrates may then be exposed to an environmental temperature sufficiently high to activate the buried hydrogen and thus fracture a transfer-layer of silicon germanium 231B, isolation dielectric 683B and relaxed silicon 621B per the depth defined by the depth of the buried hydrogen 889. The fractured surface layer may separate and leave behind the deeper sublayer regions 231A, 683A, 621A of non-transferred silicon germanium, isolation dielectric spacer, and relaxed silicon respectively on the original substrate 721A. By the perspective of FIG. 8E (relative to FIG. 8D), it may be understood that the handling substrate 885 is illustrated at the base while first substrate 721A may be pulled away (relatively). In a particular embodiment, the separation bake may be performed using a temperature between 400 and 500 degrees Celsius and below the melting temperature of the silicon germanium 231. In a particular embodiment, the fracture may transfer relaxed silicon germanium while leaving graded silicon germanium (not shown specifically) with the first silicon substrate 721A. Thus, silicon germanium 231B transferred onto oxide 223 of handling substrate 885 may be predominantly relaxed.

Figure 8E:
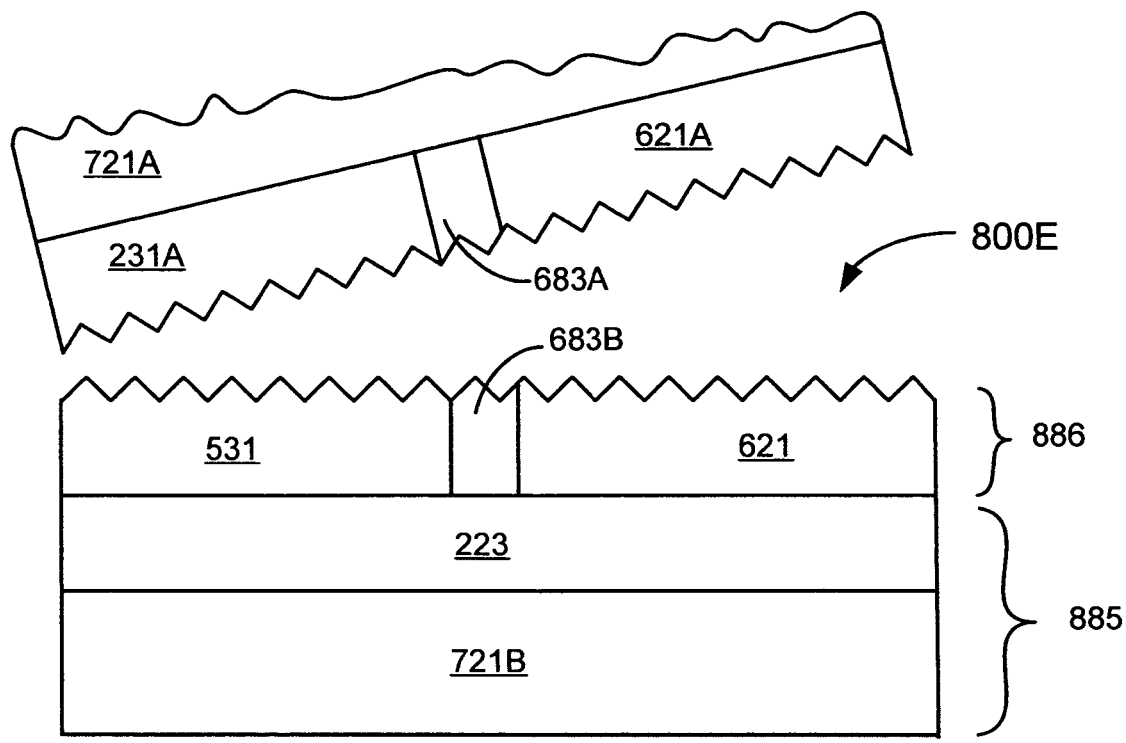
FIG. 8E is a simplified cross-sectional view of the semiconductor device of FIG. 8A in another stage of fabrication according to a method of fabricating a semiconductor device for an embodiment, showing transfer of surface layers of the silicon germanium, relaxed silicon and oxide from the first wafer to a handler wafer.

Further referencing FIG. 8E, the rough surfaces of relaxed silicon germanium 231B, relaxed silicon 621B and oxide spacer 683B that may result from the fracture, these surfaces may be planarized to form a flat surface. In some embodiments, the planarization may also remove any remaining graded silicon germanium (not shown) from the relaxed silicon germanium 231B. In a particular embodiment, the resulting thickness of the transferred silicon germanium 231B may be between about 200 and 300 nanometers.

In a further optional feature of an embodiment, additional relaxed silicon germanium may be formed over the transferred silicon germanium 231B. The additional relaxed material may comprise substantially the same concentration of germanium as that of the transferred silicon germanium 231B.

Figure 8F:
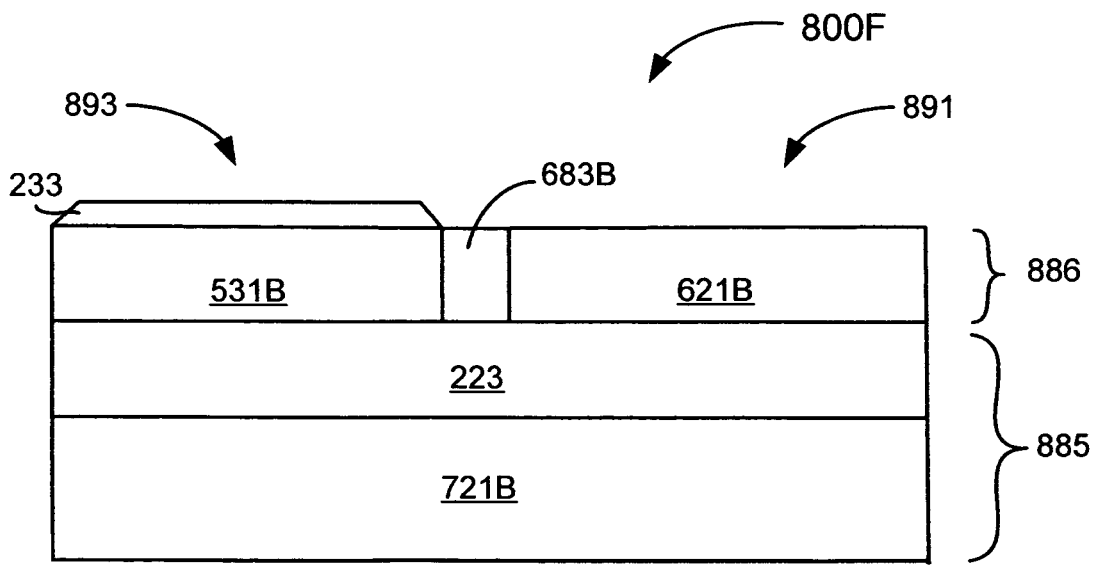
FIG. 8F is a simplified cross-sectional view of the semiconductor device of FIG. 8A in another stage of fabrication according to a method of fabricating a semiconductor device for an embodiment, showing formation of a layer of strained silicon over the silicon germanium, which might also form relaxed silicon over the silicon.

After planarizing the transferred layer 886, referencing FIG. 8F, a thin layer of silicon 233 may be deposited (e.g., epitaxially using chemical vapor deposition) over the island of silicon germanium 231B to form an island of strained silicon 893 and defining by contrast the other areas as islands of relaxed silicon 891. In a particular embodiment, the surface of the silicon germanium 231 may be previously etched slightly to reduce its height prior to the application of the strained silicon 233. The layer of strained silicon 233 may further be formed sufficiently thin so as to be strained substantially through its thickness (depth) above the silicon germanium 231. In a particular embodiment, the strained silicon may be formed with a thickness of less than about 30 nanometers. It may be further noted that while only one island of strained silicon 893 and one island of 891 may have been described relative to FIGS. 8A-8F, it may be understood that these simplistic depictions may serve merely to ease understanding of the underlying concepts of the embodiments of the present invention and to avoid unnecessary and potentially confusing complexity. Further embodiments may comprise a plurality of strained silicon islands 893, and/or a plurality of relaxed silicon islands 891.

Further, although an oxide spacer 683 may serve as isolation structure 683 for some embodiments described relative to FIGS. 8A-8F, alternative embodiments may use other means of isolation in the shallow trench between the silicon germanium and the silicon. Such alternative embodiments may use other insulating material, such as, e.g., glass, borophosphosilicate glass (BPSG), phosphosilicate glass (PSG), spin-on dielectric, etc.

Referencing FIGS. 8G-8I and FIG. 9, first semiconductor circuits may be formed in the strained silicon islands 893, and second semiconductor circuits (different and/or integrated with the first may be formed in the relaxed silicon islands 891. In some of the methods described with reference to FIGS. 8G-8I, a logic device (e.g., a MOSFET) may be formed in an island of strained silicon 893 and at least a portion of a thyristor-based memory may be formed in an island of relaxed silicon 891. In other methods, part of a thyristor-based memory (e.g., the thyristor 251) may be formed in an island of relaxed silicon 891 and an access device (e.g., a MOSFET 951) for accessing the thyristor of the memory may be formed in an island of strained silicon 893 (see FIG. 9), wherein an interconnect bridge 971 may electrically join the cathode-emitter 943 of the thyristor 251 to the drain/source 239A of MOSFET 951.

Electrodes 227A and 227B for MOSFET gates (FIG. 8G) may be formed over dielectric (e.g., gate oxide) layers 238 and in insulated relationship over respective body regions 241A, 241B. Additionally, the electrode 227C for the capacitor of capacitively-coupled thyristor may be formed in insulated relationship to a base region for a thyristor region 253. The capacitor electrode 227C may thus be described as capacitively coupled to the base region via dielectric 238 (e.g., a thermal or gate oxide or other insulator). In one example, the dielectric 238 may be formed with a thickness of between 5 nm and 30 nm, more typically about 10 nanometers. The polysilicon for the electrodes may be formed with a thickness of between about 80 nm and 1000 nm, and typically around 200 nanometers.

Although shown in this embodiment with about equal thickness for gate dielectrics 238 and dielectric of capacitor electrode 227C; it may be understood that for other embodiments the thickness of the capacitor dielectric associated with electrode 227C may be thicker than the gate oxides or gate dielectrics associated with the MOSFET gates 227A and 227B.

Figure 8G:
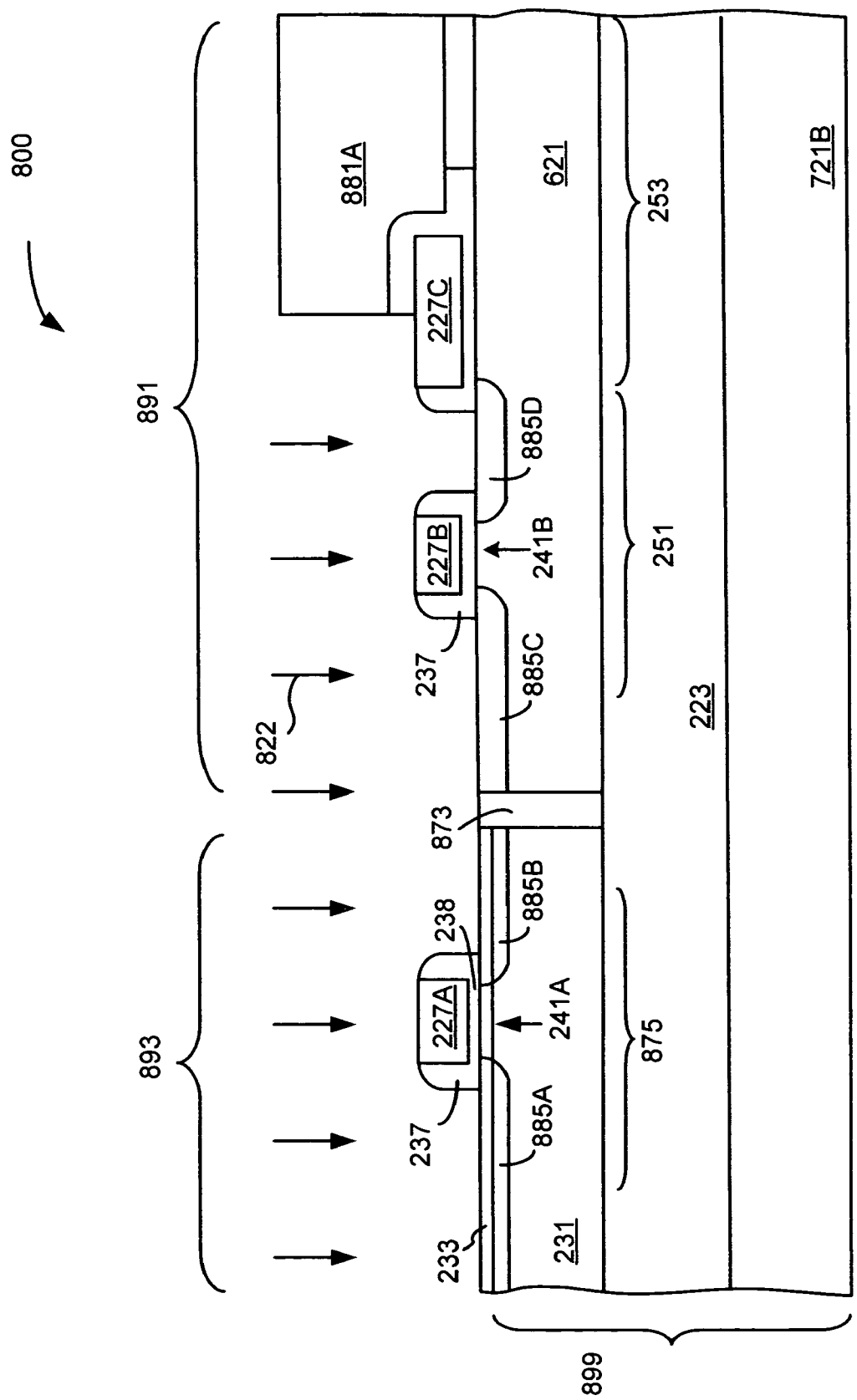
FIG. 8G is a simplified cross-sectional view of the semiconductor device of FIG. 8A in a further stage of fabrication according to a method of fabricating a semiconductor device for an embodiment, showing formation of extension regions to MOSFET devices, and the layering and patterning of dielectric to form a mask to assist with the formation of certain regions for the access transistors and for the thyristor-based memory.

Further referencing FIG. 8G, photoresist 881A may be formed to mask portions of the substrate to be associated with thyristor regions. The other regions for the semiconductor device 800 may be then processed to define, e.g., at least parts for access device 251 and logic device 875 (e.g., MOSFET). The n-type extension regions 885A-D (e.g., for lightly-doped drain or LDD regions) may be formed about gate electrodes 227A, 227B by an implant of n-type dopant 822. In one embodiment, the implants for the extension regions may be formed using phosphorous with an implant dosage of about $8 \times 10^{14}$ per cm². Additionally, it may be understood that these extensions may be formed before development of sidewalls 237 against the polysilicon for the electrodes 227A-C. In some embodiments in technologies of 130 nanometers and below, the LLD regions may be implanted as source/drain extensions using arsenic as a dopant and implanting at energies ranging from approximately $10^{15}$ KeV to approximately $10^{20}$ KeV.

Halo implants might also be formed around the gate electrodes—i.e., between or proximate the extension regions 885A-D and the body regions 241A, 241B. In a particular embodiment, the halo implants may be formed with, e.g., boron implanted with a given implant angle.

Although particular magnitudes may be described for the doping levels, material thickness, extents and dimensions for given embodiments; it will be understood to those of ordinary skill in this art that these magnitudes may be merely exemplary and that alternative magnitudes may be available therefore—e.g., alternative parameters for the oxide thickness, implant species or densities as may be used for defining such devices of alternative specifications. For example, the gate dielectric 238 may comprise a thermal oxide of about 2 nanometers, and the N-type extension regions may be formed from a species of arsenic implanted with, e.g., a 0-degree angle. After the extension and halo implants, a dielectric such as nitride may be formed conformal to and over the substrate and electrodes. An anisotropic etch may be used to etch the dielectric and form sidewall spacers 237 against the sidewalls of the electrodes. In some embodiments, sidewall spacers may be formed while masking regions of the substrate for the thyristor, while in other embodiments the formation of sidewall spacers may be deferred until after definition of the thyristor.

Further referencing FIG. 8G, spacers 237 may be formed against the sidewalls of electrodes 227 and then N-type species 822 may be implanted with higher level energy to form the deep level (e.g. N+) source and drain regions 239 about gate electrode 227B, and source and drain regions 573A and B about gate electrode 227A. In a particular embodiment, these deep implants may use species such as arsenic and may be aligned relative to sidewall spacers 237 about electrodes 227A, 227B, and 227C. In one example, the deep implant for the source/drain regions may use an energy and dosage to penetrate a full depth of the layer of semiconductor material over the buried oxide of the SOI-type substrate structure—i.e., a full depth of silicon 621 of island 891 and that of the combined layers of strained silicon 233 and silicon germanium 231 of island 893. The implanted regions may extend respective depths toward oxide layer 223 of SOI substrate 899. In one embodiment, an implantation energy may be about 40 KeV with implant dosage of about $2 \times 10^{15}$ cm$^{-2}$.

Figure 8H:
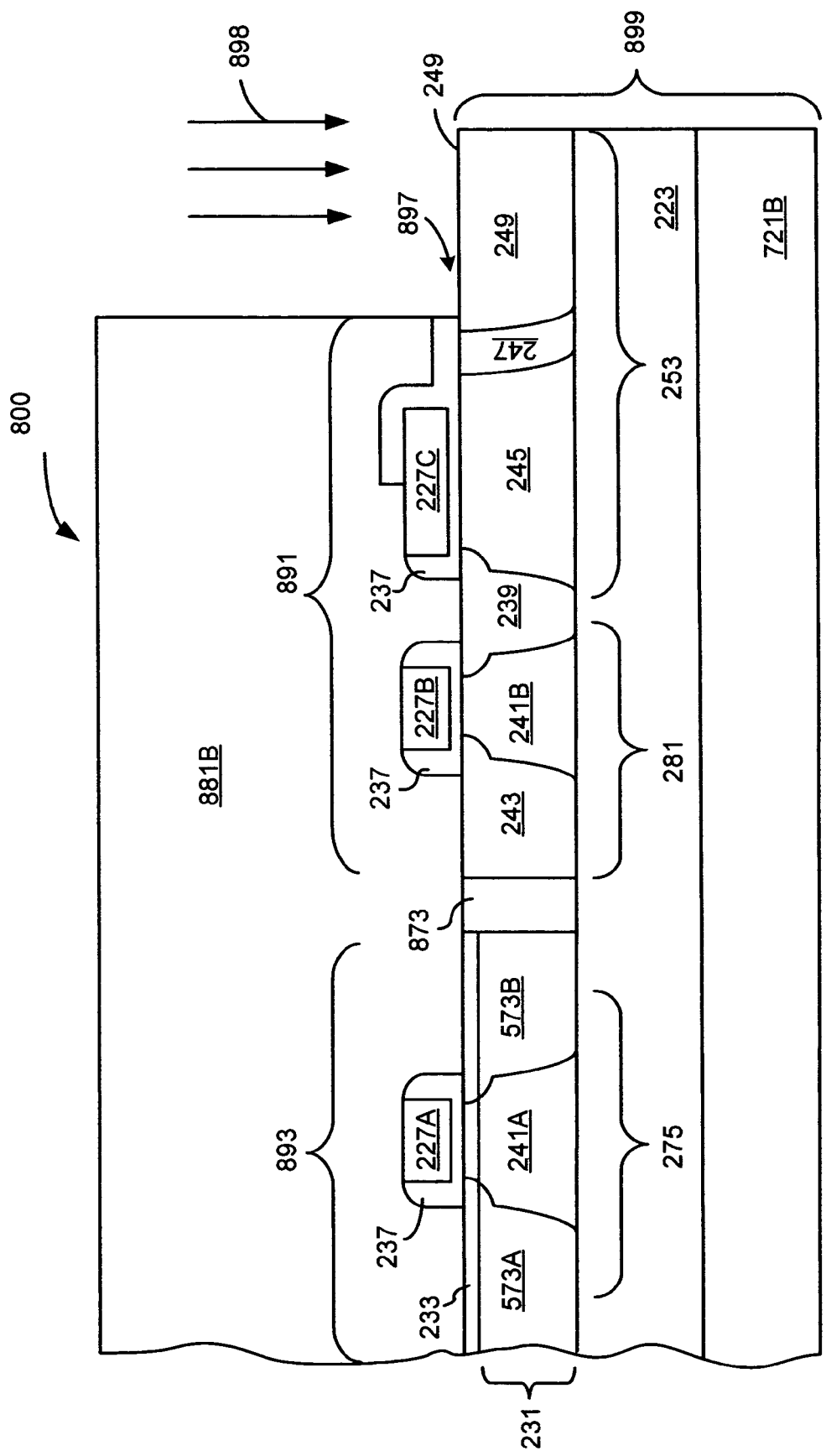
FIG. 8H is a simplified cross-sectional view of the semiconductor device of FIG. 8A in a further stage of fabrication according to a method of fabricating a semiconductor device for an embodiment, showing the formation of an anode-emitter region for a thyristor to a thyristor-based memory.

Further referencing FIG. 8H, photoresist 881B may then be applied to the device and patterned to define an exposure window through which regions of the thyristor may then be further defined. The previously defined logic devices of source and drain regions 573A, 573B, 243, 239 may then be masked by photoresist mask 881B for protection while implanting base and anode-emitter regions to thyristor device 891. Accordingly, logic devices such as MOSFET 275 across the strained silicon regions 893 may be protected during the formation of dopant regions to the thyristor device. In further embodiments, the logic devices in addition to the MOSFET access transistor 281 within the relaxed silicon 891 of thyristor memory device may be protected. Initially, after masking, an angled implant with n-type dopant may be performed for formation of the n-base region 247 for the thyristor and also for definition of a boundary to the thyristor's p-base region 245. The angle of the angled implant and the alignment to the lateral edge 897 of the mask that extends from the sidewall of the capacitor electrode 227C may serve to define the lateral extent of the n-base region relative to the capacitor electrode. These parameters may be selected to form the n-base with a slight lateral offset outward from the capacitor electrode 227C so as to avoid overlap thereby and possible GIDL (Gate Induce Drain Leakage) types of effects.

Following the angled implant for the base region definition, a direct implant 898 with dopant of conductivity type opposite that for the base region may then be performed for defining anode-emitter region 249 for the thyristor 253 of thyristor-based memory in relaxed silicon region 891. After defining the variously-doped regions for the thyristor-based memory and logic and strained silicon regions 893 and relaxed silicon regions 891, photoresist mask 881B may be removed.

Figure 8I:
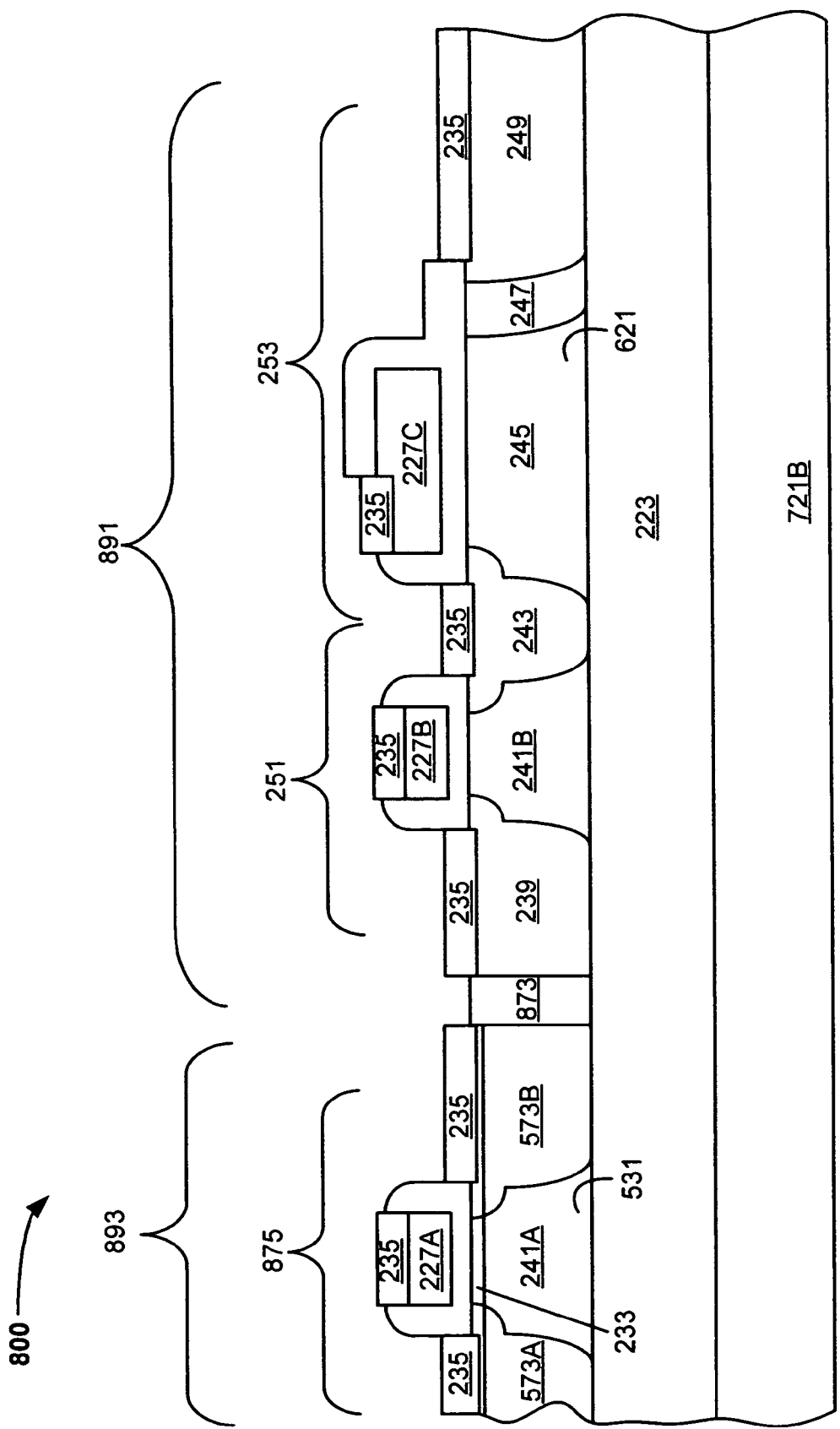
FIG. 8I is a simplified cross-sectional view of the semiconductor device of FIG. 8A in a further stage of fabrication according to a method of fabricating a semiconductor device for an embodiment, showing the formation of salicides for logic device in strained silicon regions and salicides for select portions to a memory device in the relaxed silicon regions.

Referencing FIG. 8I, salicide may then be formed over the exposed regions of silicon as defined by sidewall spacers 237, isolation dielectric 873, and a dielectric over the shoulder of the capacitor-electrode 227 of the thyristor device. Further processing, as known, may then be used to couple the anode-emitter region of the thyristor for receiving a voltage reference bias and for electrically coupling bitlines to the source/drain region 239 of the access transistor 251 via salicide contact 235.

Logic 875, for example, in one embodiment, might then be intercoupled with the thyristor-memory using known interlayer metallization techniques. Such logic may include, for example, sense amplifiers, combinatorial logic for accessing particular rows and columns of the thyristor-memory, and/or for defining read/write control circuitry.

Ultimately, further possible semiconductor processing steps (e.g., dopant implants, sidewall formation (if not previously performed), metal deposition and patterning, passivation and pad masking, salicide formation) may lead to the further integration of the thyristor-based memory into resulting semiconductor device 800.

For example, in one embodiment, referencing FIG. 8I, the portion for the thyristor-based memory may be formed in the island of relaxed silicon 891 and a MOSFET 875 for logic devices may be formed in the island of strained silicon 893. The MOSFET's 875 channel region may be formed to incorporate at least a portion of the strained silicon 633. This MOSFET 875 may thus be formed as a low-voltage device and as part of a larger logic device. The portion of a thyristor-based memory cell disposed in the island of relaxed silicon 891 may be formed to comprise thyristor 253 and an access device 251, and may be similar to those described in reference to FIG. 2, except that they may not comprise strained silicon.

Figure 9:
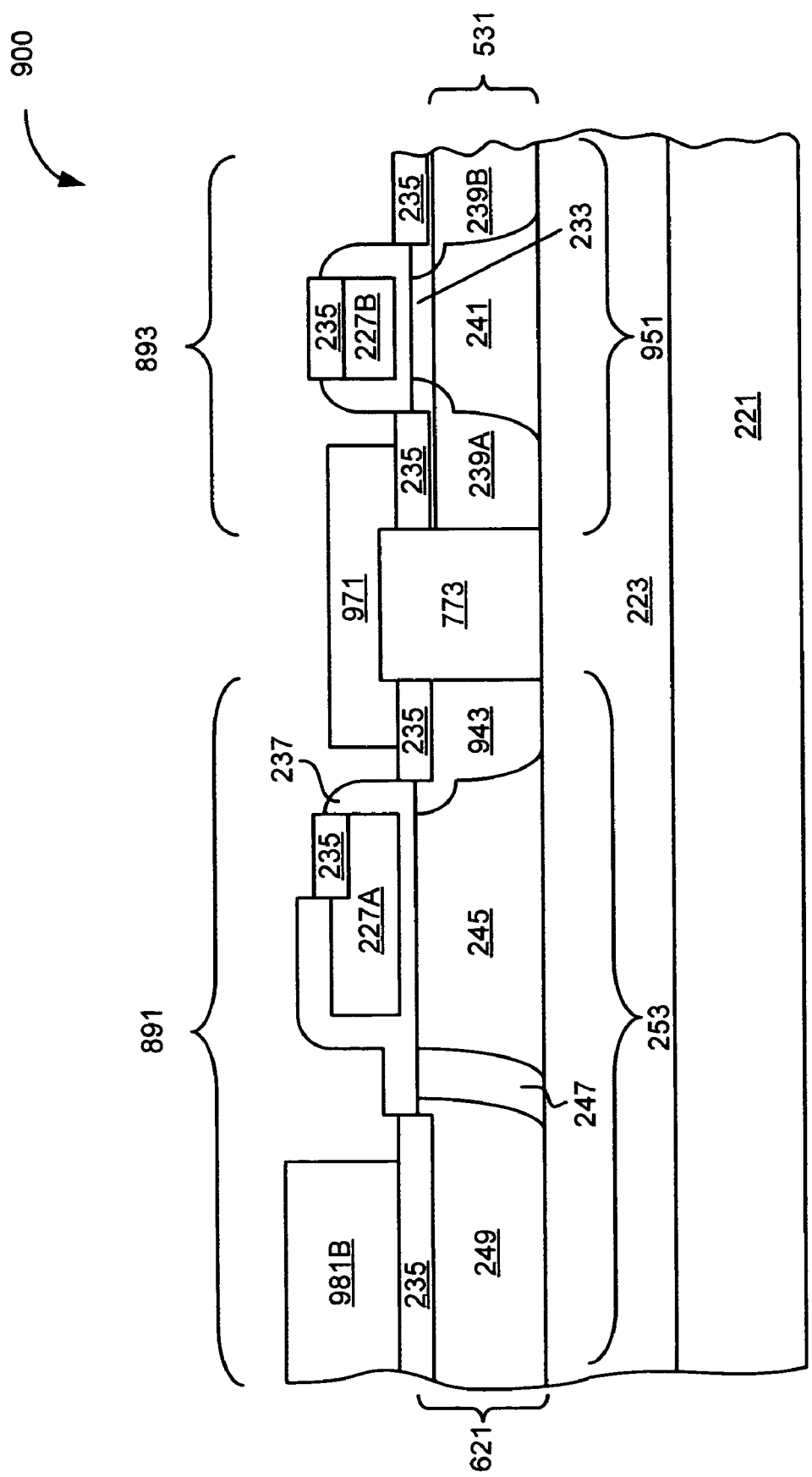
FIG. 9 is a simplified cross-sectional view of the semiconductor device of FIG. 8A in a further stage of fabrication according to a method of fabricating a semiconductor device for an embodiment, showing further formation of thyristors in relaxed silicon regions and access transistors in strained silicon regions.

Referencing FIG. 9, the formation of a thyristor-based memory device 900, in accordance with another embodiment, may comprise forming thyristor 253 in the island of relaxed silicon 891 and an access device 951 (e.g., MOSFET) in the island of strained silicon 893. Shallow trench isolation structure 773 may be disposed between the island of relaxed silicon 891 and the island of strained silicon 893. The cathode-emitter region 943 of thyristor 253 may be electrically coupled in series to source/drain region 239A of access device 951 via interconnect bridge 971. An inversion channel (not shown), which may be induced by gate electrode 227B, may include partly or wholly the thickness of strained silicon 633 of strained silicon island 893. In such embodiment, the processes of forming the well regions for the devices may be similar to those discussed with reference to FIG. 8A-8I, but with a different location for the access device.

Again, it may be noted that spacers 237 against the sidewalls of the MOSFET electrode 227B and capacitor electrode 227A may be used in connection with the dielectric of the isolation trench structure 773 to define exposed regions of the substrate—i.e., exposed regions over strained silicon region 531 and relaxed silicon region 621 to receive silicide. These exposed regions may receive refractory metal by selective CVD deposition and may then be annealed to form salicide 235. In regions where the metal is in contact with silicon it may react to form salicide. The metal in contact with SiO2 or some other oxide may not react with the oxide. The device can be dipped in an acid after the salicide anneal that will remove the unreacted metal (metal over oxide) to leave the salicide only on regions of exposed silicon. This may result in a self aligned silicide or "salicide". The silicide may serve to lower the electrical resistance over upper surface regions of the cathode-emitter 249, capacitor electrode 227A, anode-emitter 943 and source/drain regions 235A, 239B of the access device 951. Further, a metallization contact 981B may be formed to contact an interlayer metal via that may be operable to source a voltage reference for biasing thyristor 253.

Figure 10A:
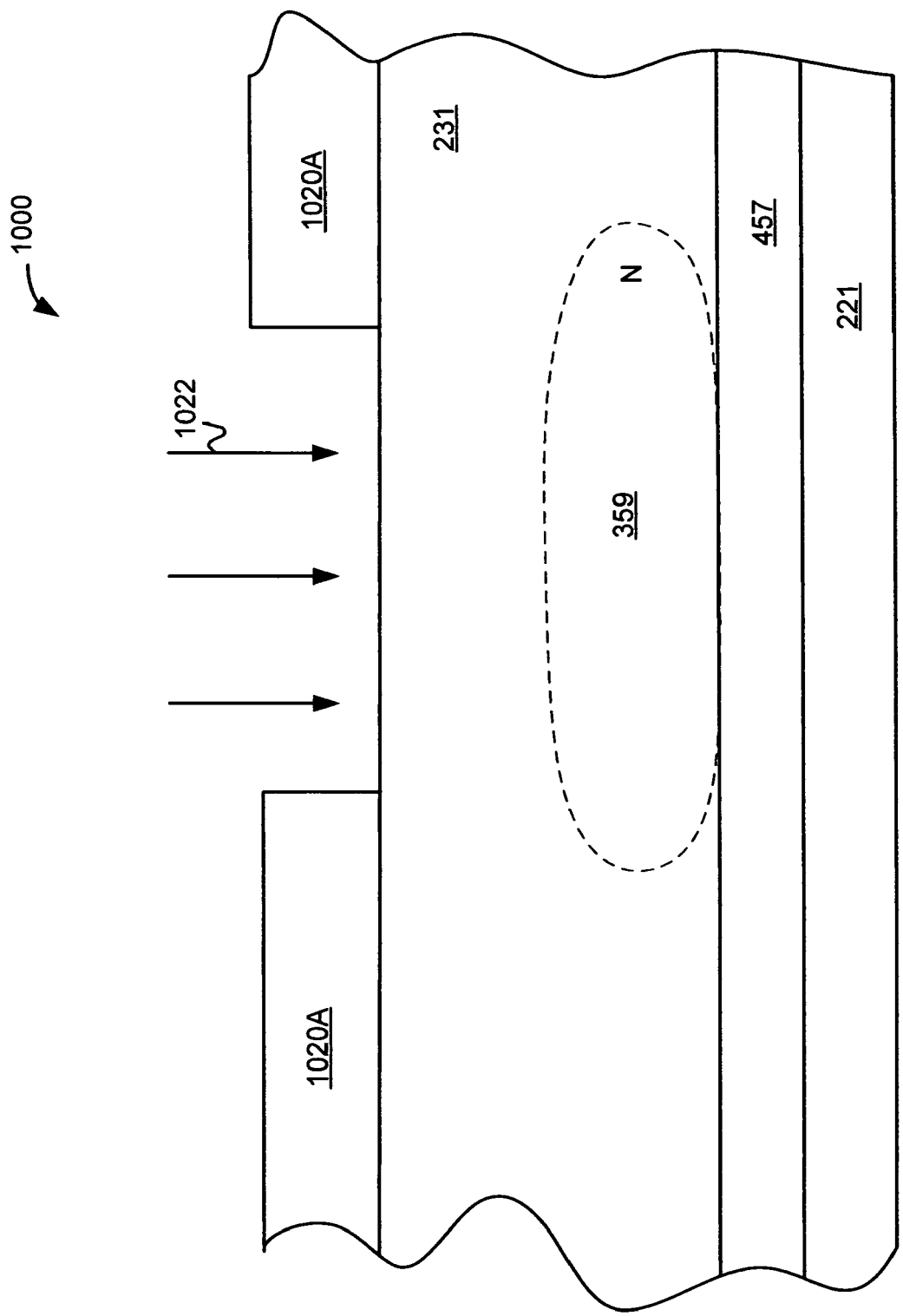
FIG. 10A is a simplified cross-sectional view of a semiconductor device in an early stage of fabrication according to a method of fabricating a semiconductor device consistent with an embodiment of the present invention, showing a silicon substrate with formation of graded silicon germanium and relaxed silicon germanium, respectively, and formation of a buried n-well in the silicon germanium.

In a further embodiment, referencing FIG. 10A, graded silicon germanium 457 may be epitaxially formed (e.g., using heteroepitaxy, psuedomorphic growth, molecular beam epitaxy, ultrahigh-vacuum chemical vapor deposition, or other processes) over silicon of substrate 221. A deep layer of relaxed silicon germanium 231 may be formed epitaxially and contiguously over graded silicon germanium 457. In this embodiment, further referencing FIG. 10A, pillars of semiconductor material that are to be formed from the silicon germanium region over the substrate may be doped with different doping conductivity type at different elevations. In particular embodiments, the pillars may be defined by the formation of trenches in the silicon-germanium. Additionally, capacitor electrodes may be formed in the trenches between the pillars and coupled to select regions of the pillars.

During an initial stage of fabrication, e.g., further referencing FIG. 10A, masking material may be patterned (e.g., using photolithography) to form mask 1020A over silicon germanium 231. The patterning of the mask 1020A may form sidewalls to define a window by which to expose portions of relaxed silicon germanium 231.

In a particular embodiment, silicon germanium 231 may initially be doped for a p-type conductivity. Retrograde n-well 359 may be formed (e.g., by implantation with n-type ions 1022) into exposed areas of the silicon germanium as defined by the window of mask 1020A. The n-type implants may be buried into and through depth(s) of the silicon germanium sufficient to enable surrounding a desired anode-emitter region for a thyristor.

Further referencing FIG. 10A, it may be noted that during implant, the ions may collide with substrate atoms and scatter in various directions, including laterally. The distribution of the n-type dopant ions 1022 being implanted therefor may result in a Gaussian distribution for the implants about an average depth therefor. The lateral extent of the scattering, thus, may be related to the Gaussian distribution, which may characterize the lateral extent of the implants beneath the sidewalls of mask 1020A that define the opening.

Figure 10B:
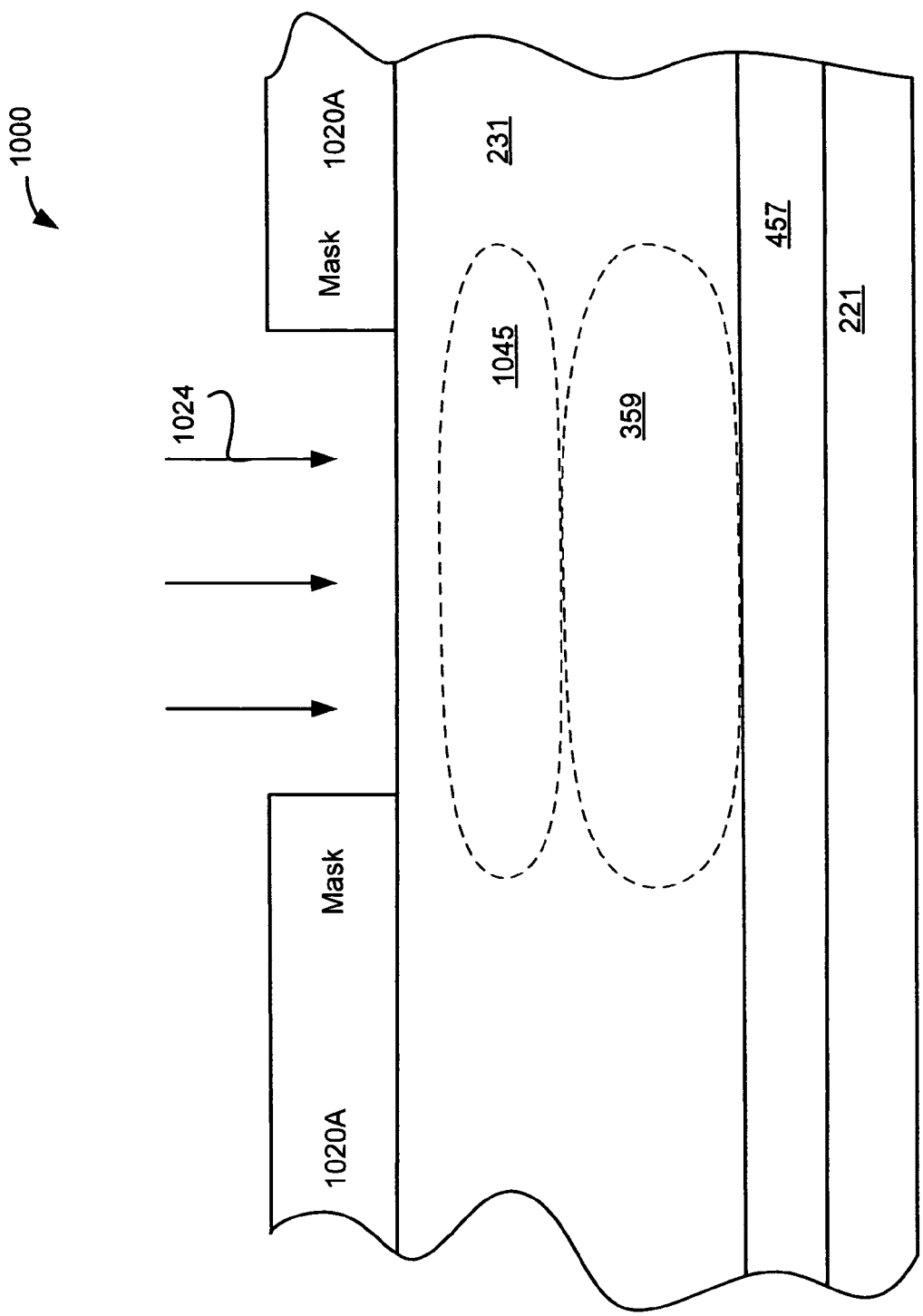
FIG. 10B is a simplified cross-sectional view of the semiconductor device of FIG. 10A in another stage of fabrication according to a method of fabricating a semiconductor device for an embodiment, showing the formation of a buried p-type region.

Referencing FIG. 10B, p-type dopant 1024 may also be implanted into exposed regions of the silicon germanium as defined by mask 1020A and with energy sufficient for placement at depths desired for p-base regions 1045 to thyristors. The p-type dopant 1024 may be implanted with less implantation energy than that used to implant the n-well 359, thereby forming a distribution for the p-base region 1045 above the previously discussed retrograde n-well region 359.

However, there may be other methods of forming p-base regions 1045 with depths shallower than n-well 359 that do not depend on changing the implantation energy. For example, oxide may be formed over the surface of relaxed silicon germanium 231, per the window defined by mask 1020A. The implanted p-type ions may then collide with oxide ions, scattering and forming a distribution therefor at a shallower depth.

Figure 10C:
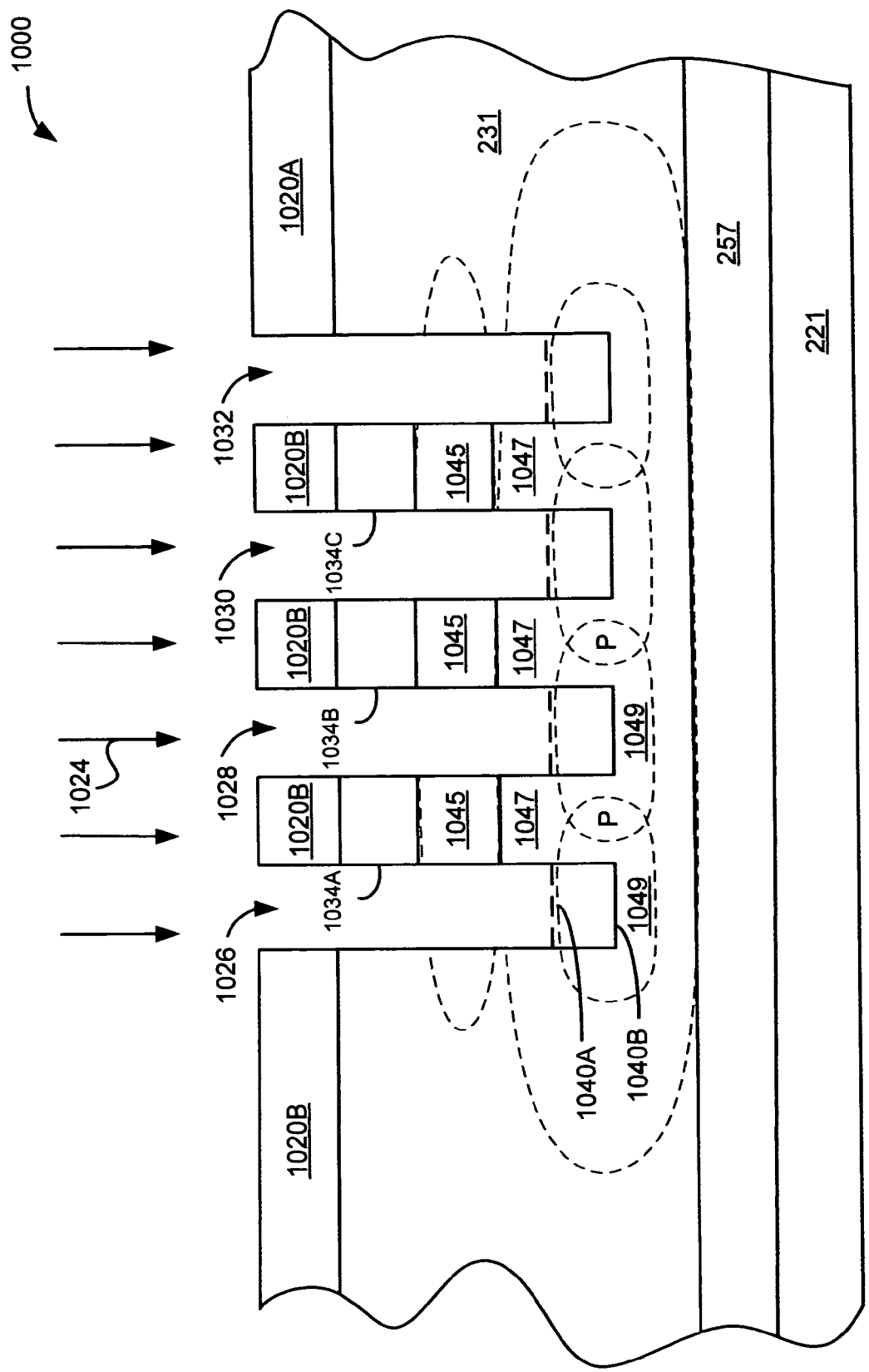
FIG. 10C is a simplified cross-sectional view of the semiconductor device of FIG. 10A in another stage of fabrication according to a method of fabricating a semiconductor device for an embodiment, showing the etching of trenches, for the definition of thyristor pillars, and the formation of anode-emitter regions to thyristors to be partly formed in the pillars.

Next, initial mask 1020A may be removed and second etch-resistant material (e.g., oxide or nitride) deposited and patterned over areas of the relaxed silicon germanium to define mask 1020B, referencing FIG. 10C. The patterned mask 1020B may protect regions of semiconductor material intended for pillars 1034A, 1034B, 1034C. Trenches 1026, 1028, 1030, 1032 may then be formed by etching anisotropically into exposed regions of the silicon germanium 231 as defined by mask 1020B. In one embodiment, trenches 1026, 1028, 1030, 1032 may be etched to define a temporary trench floor 1040A at an elevation to be associated with an upper boundary for anode-emitter region 1049 as desired for the thyristors to be formed in the pillars 1034A, 1034B, 1034C. P-type dopant 1024 may then be implanted with sufficient energy to scatter laterally into the pillars 1034A, 1034B, 1034C for the formation of p-type, anode-emitter regions therein. It may also penetrate a depth beneath the floors for the trenches 1026, 1028, 1030, 1032 and establish extents for anode-emitter regions 1049.

Further referencing FIG. 10C, trenches 1026, 1028, 1030, 1032 may then be further etched to lower trench floors 1040A to new elevations 1040B, and to further define sidewalls about the respective portions of anode-emitter regions 1049 within the pillars.

Figure 10D:
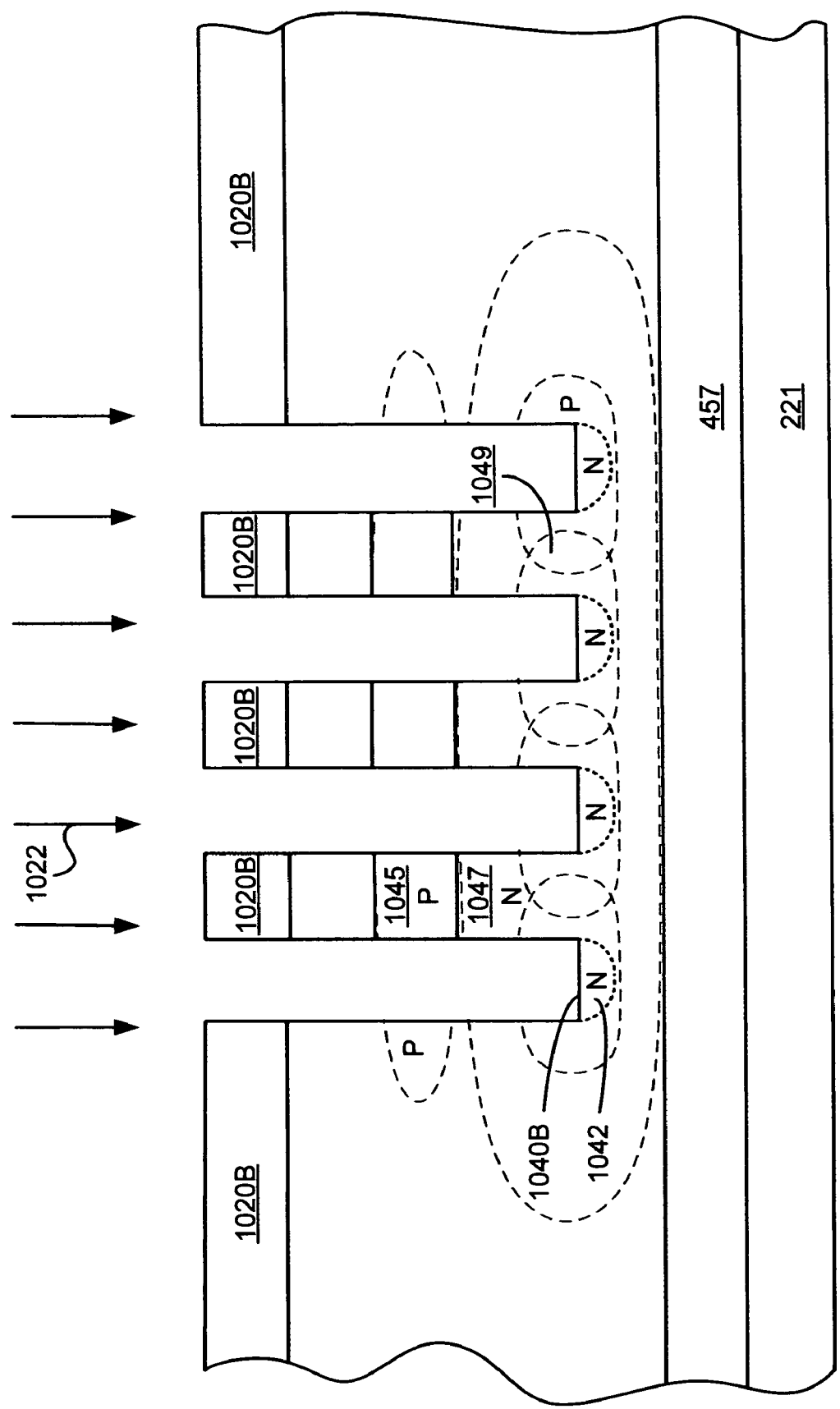
FIG. 10D is a simplified cross-sectional view of the semiconductor device of FIG. 10A in another stage of fabrication according to a method of fabricating a semiconductor device for an embodiment, showing the formation of a minority carrier isolation device at the trench floors.

Referencing FIG. 10D, n-type dopant 1022 may be implanted with light implantation energy, for some embodiments, into floors 1040B of the trenches to define minority carrier isolation devices 1042 (buttons) within and at least partially surrounded by common anode-emitter regions 1049. In some embodiments, a spacer, (not shown) is put onto the trench side walls to prevent the n implant from being implanted into the side walls, the spacer is removed after implant. As discussed above with reference to FIG. 3, the minority carrier isolation devices 1042 may function to collect or absorb extraneous minority carriers in the anode-emitter regions 1049.

Figure 10E:
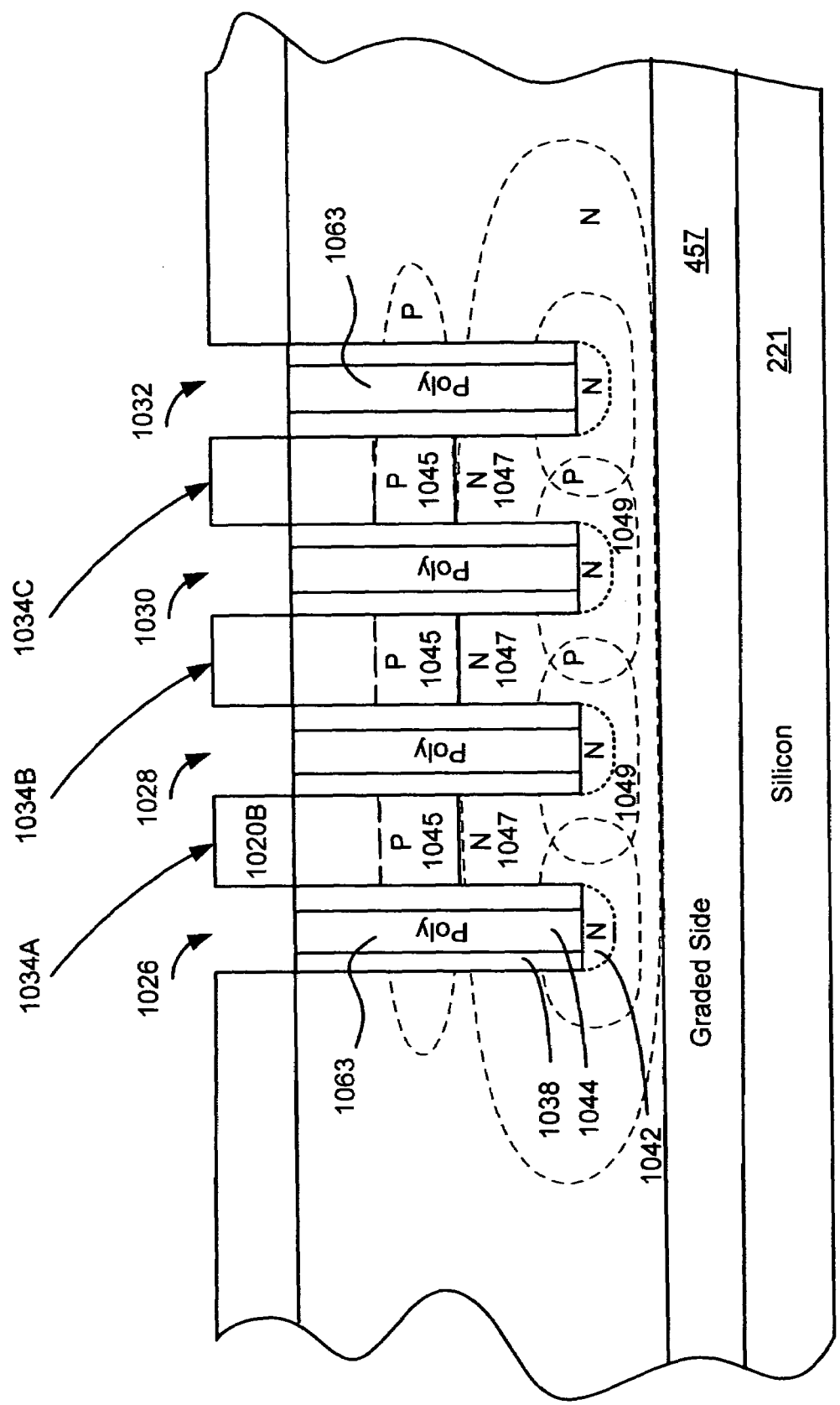
FIG. 10E is a simplified cross-sectional view of the semiconductor device of FIG. 10A in another stage of fabrication according to a method of fabricating a semiconductor device for an embodiment, showing the deposition of dielectric and conductive filler material in the trenches that may be used for forming isolation structures at the trench bottoms, between the thyristor pillars.

Referencing FIG. 10E, dielectric 1038 (e.g., thermal oxide) may be formed conformally and then etched anisotropically to form thin layers thereof against sidewalls (lining sidewalls) of the pillars 1034A, 1034B, 1034C. A conductive filler material 1063 (e.g., polysilicon) may then be formed between the dielectric 1038 sidewall/liners. In a particular embodiment, the materials 1038, 1063 may be layered by known processes such as chemical vapor deposition, plasma enhanced, selective, or thermal assisted, etc.

Referencing FIG. 10F, conductive filler material 1063 (and dielectric 1038) may be etched anisotropically to an elevation slightly below the boundary for/between p-base region 1045 and n-base region 1047 of the intended thyristor. The conductive filler material 1063 remaining may be kept insulated from n-bases 1047 by dielectric 1047. In a particular embodiment, the insulator-lined conductive filler material 1063 may be electrically coupled to a voltage source and may, thus, further serve to isolate the n-bases of the different thyristors from one another. These types of structures, as discussed above with respect to FIG. 3, may be further described in "Trench Isolation for Thyristor-Based Device," U.S. Pat. No. 6,229,161; hereby incorporated by reference.

Figure 10F:
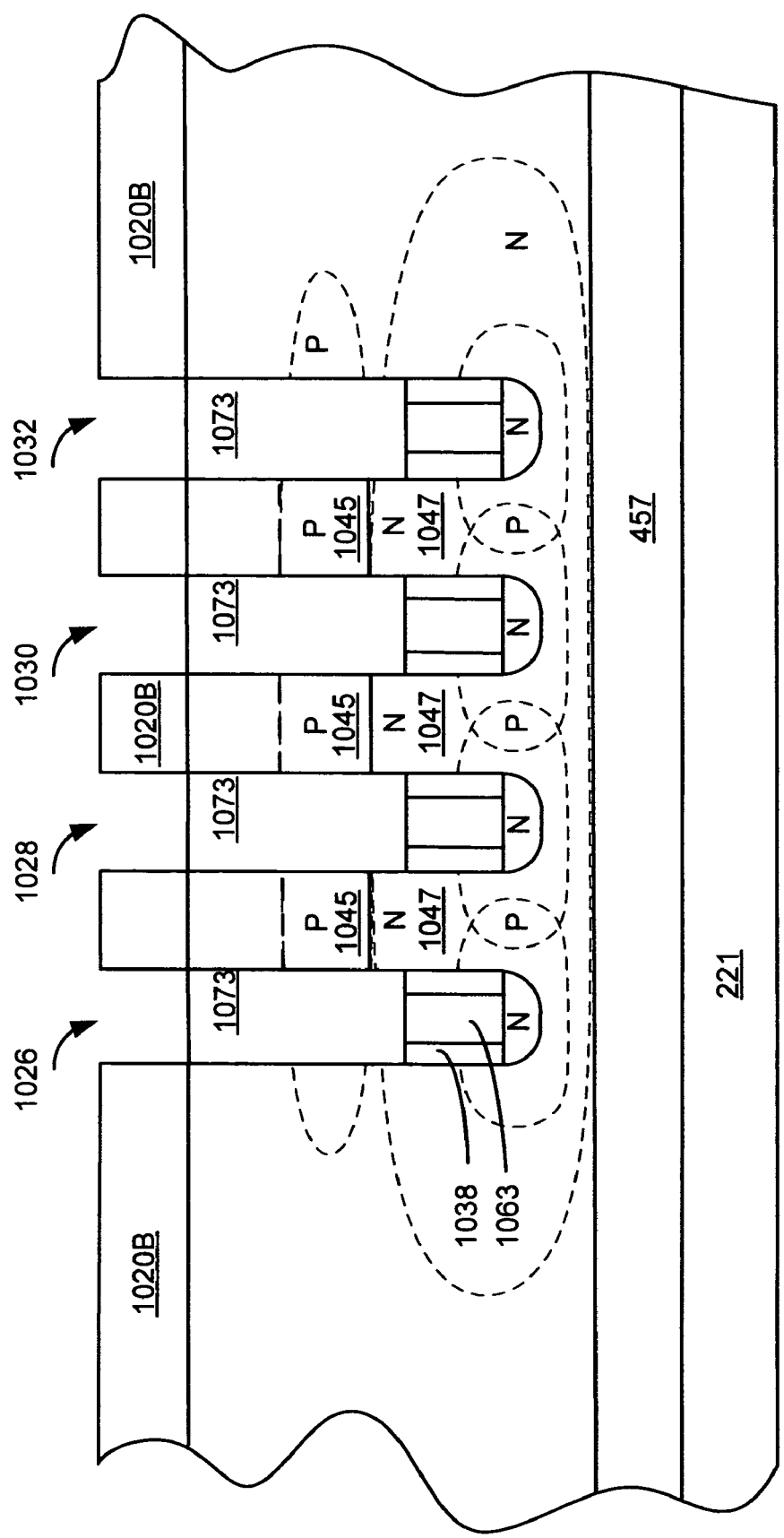
FIG. 10F is a simplified cross-sectional view of the semiconductor device of FIG. 10A in another stage of fabrication according to a method of fabricating a semiconductor device for an embodiment, showing the etching of the dielectric and conductive filler material for defining the conductive isolators at the trench bottom between pillars and/or as may be associated with minority carrier isolation.

The regions of the trenches 1026, 1028, 1030, 1032 above the insulatively lined conductive filler material 1063 may then be filled with insulating material 1073, such as oxide as further illustrated in FIG. 10F.

Figure 10G:
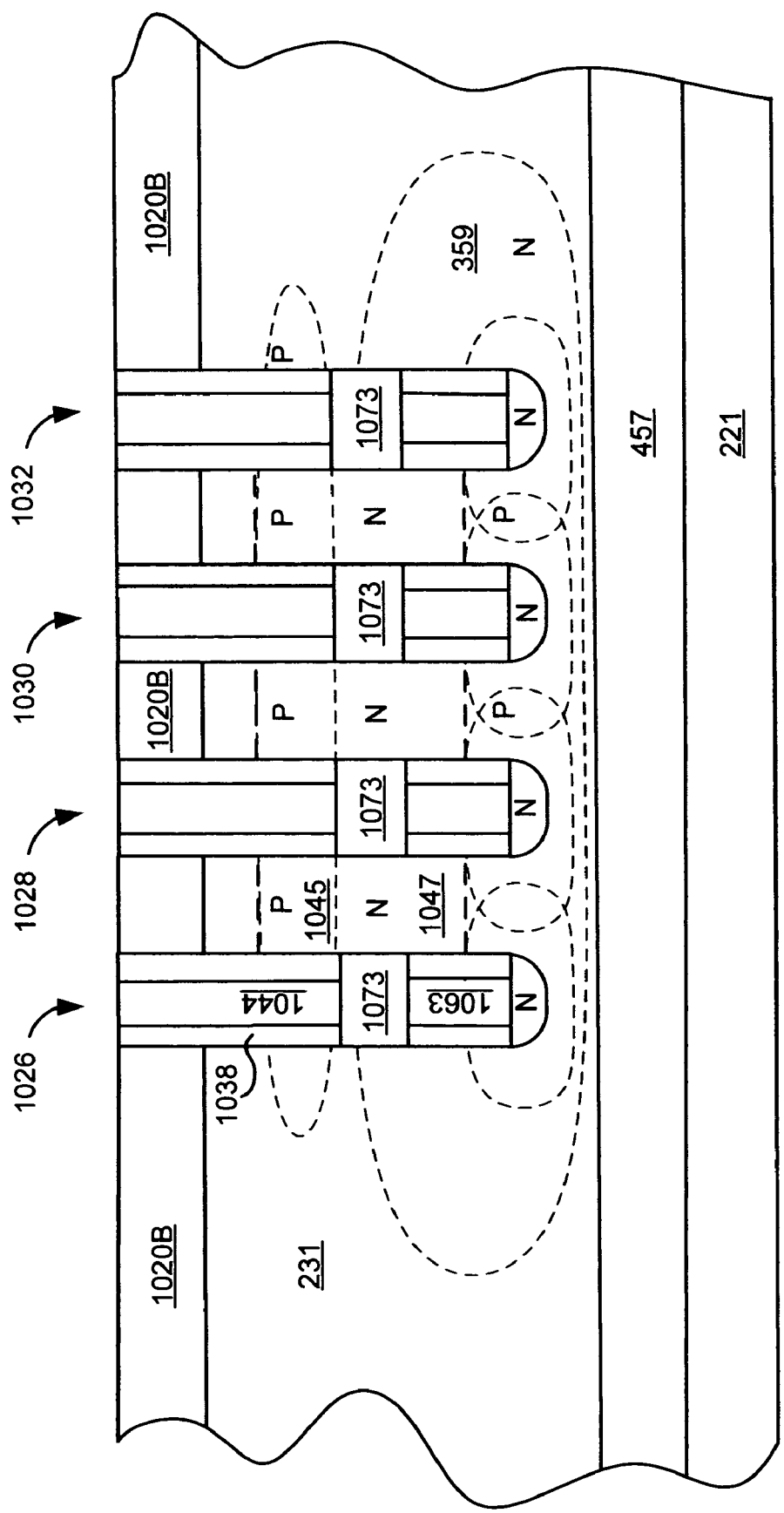
FIG. 10G is a simplified cross-sectional view of the semiconductor device of FIG. 10A in another stage of fabrication according to a method of fabricating a semiconductor device for an embodiment, showing the etching of oxide to a given elevation and then the deposition of dielectric material against exposed sidewalls that define the trenches and further filling of the trenches between the dielectric liners with conductive filler material.

Moving forward with reference to FIG. 10G, the oxide (or other insulator) 1073 may be etched (e.g., anisotropically) to a level similar to the boundary between p-base 1045 and n-base 1047.

Further referencing FIG. 10G, gate dielectric 1038 may be formed on the exposed sidewalls of the trenches 1026, 1028, 1030, 1032 at elevations above the etched insulator (e.g., oxide) 1073. Conductive filler material (e.g., polysilicon) 1063 for a capacitor electrode may then be formed between the dielectric 1038 lined trenches.

Figure 10H:
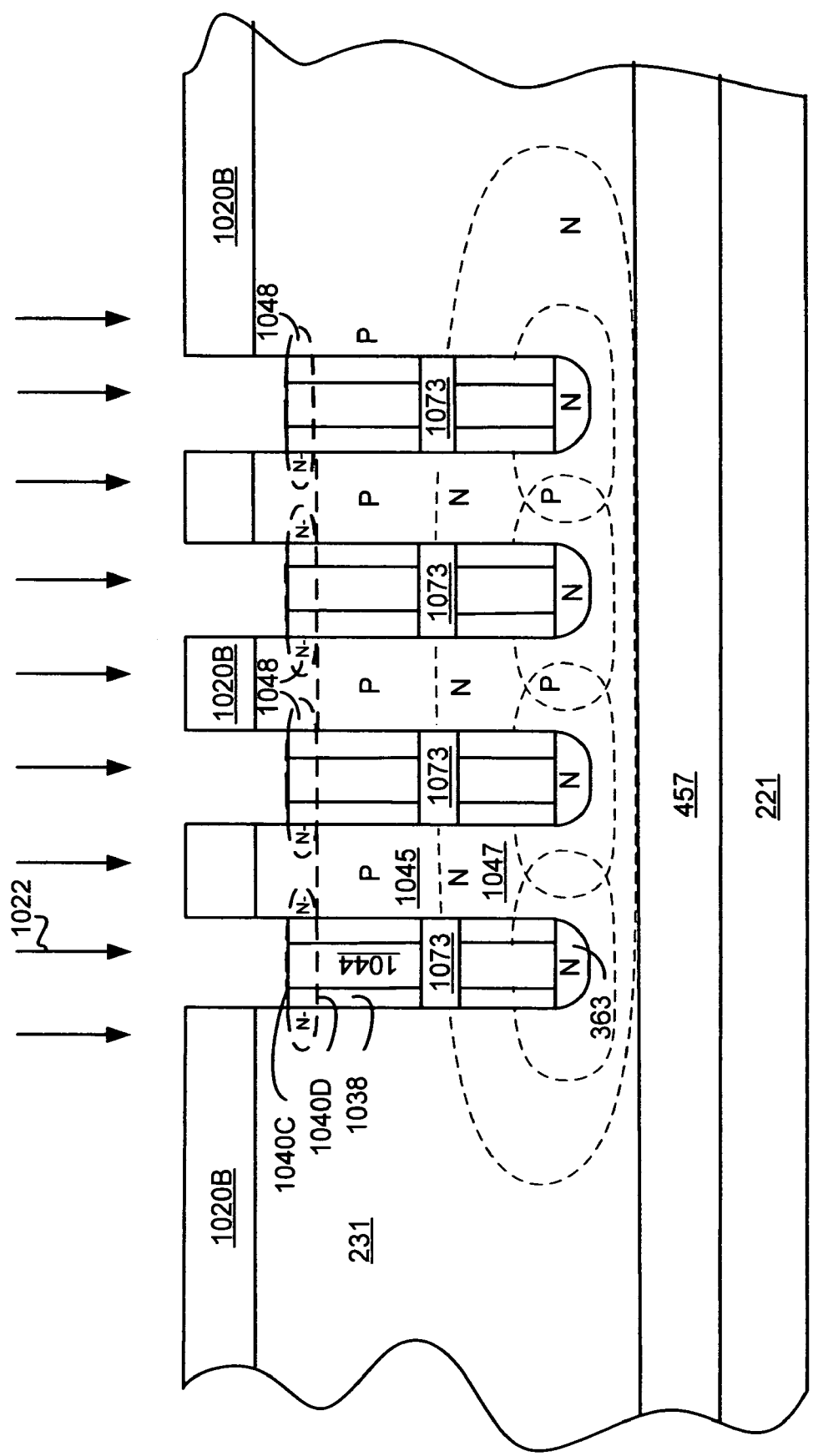
FIG. 10H is a simplified cross-sectional view of the semiconductor device of FIG. 10A in another stage of fabrication according to a method of fabricating a semiconductor device for an embodiment, showing the etching of the dielectric and conductive filler material and the formation of lightly-doped n-type regions in the pillars of semiconductor material for regions of the thyristors to be proximate a capacitor electrode.

Referencing FIG. 10H, the dielectric 1038 and conductive filler material 1063 may be etched to form a temporary floor 1040C for the trench at an elevation slightly above the upper boundary of p-base 1045. In a given embodiment, this etch may be formed anisotropically using previously defined mask 1020B as an etch mask. The etch may remove both conductive material 1063 and dielectric material 1038 (e.g., polysilicon and oxide).

N-type dopant 1022 may then be implanted through the openings in the masks 1020B. The n-type ions 1022 implants may penetrate the temporary floor 1040C and scatter laterally upon impact to scatter dopant and form n-type lightly-doped (drain) regions 1048.

In a further optional embodiment, further referencing FIG. 10H, the floor 1040C of the trenches may be further etched to define new floor 1040D that may be level to the upper boundary of p-base 1045, and at an elevation just beneath the lower boundary of the previously defined n-type lightly-doped region 1048. Next, the masks (e.g., nitride or oxide) 1020B may be removed. The trenches may then be filled with oxide 1073 and planarized (e.g., chemical mechanical polishing (CMP)) to define a level upper surface.

Figure 10I:
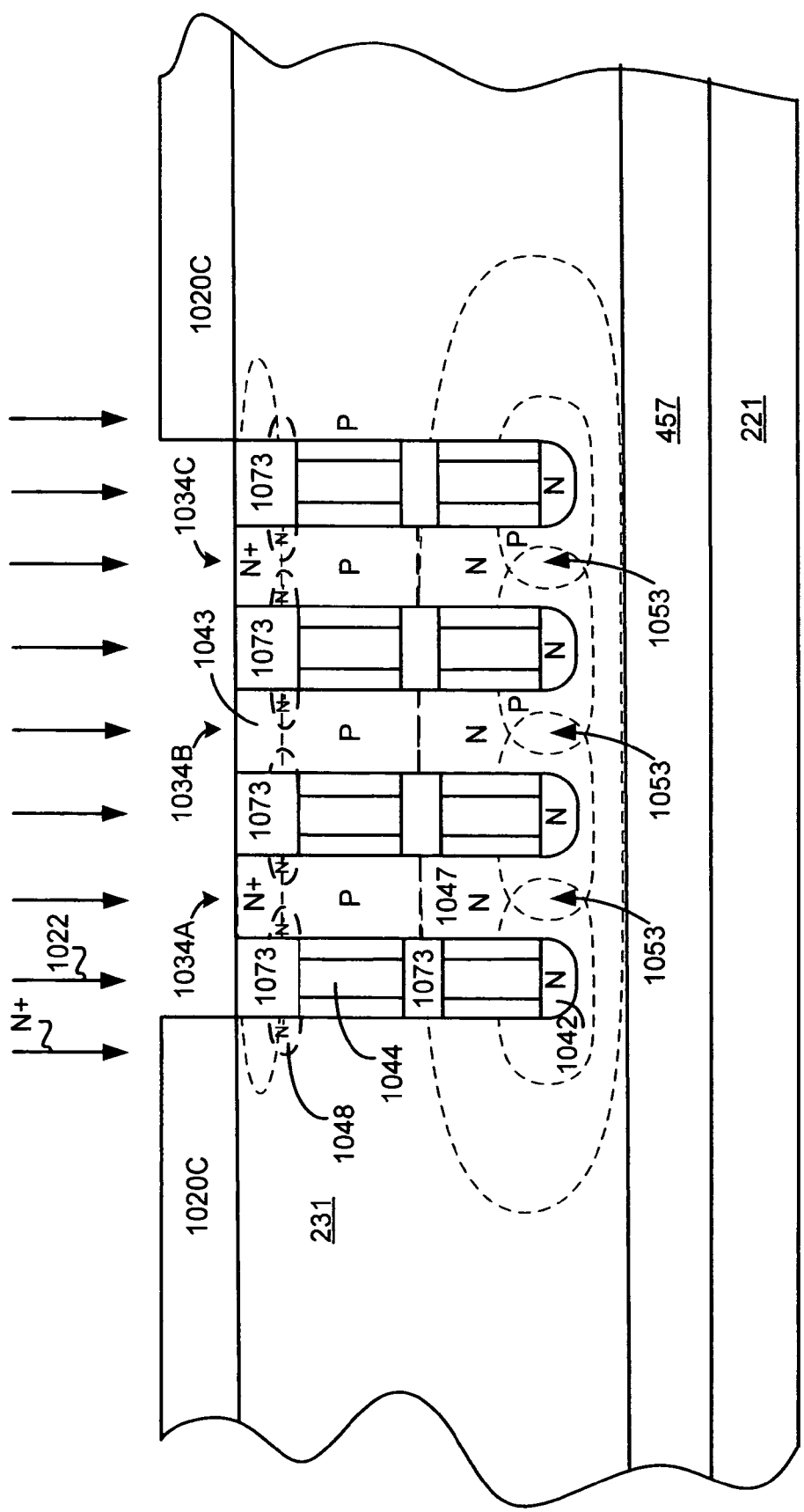
FIG. 10I is a simplified cross-sectional view of the semiconductor device of FIG. 10A in another stage of fabrication according to a method of fabricating a semiconductor device for an embodiment, showing the filling of remaining regions of the trenches with oxide and the formation of cathode-emitter regions.

Referencing FIG. 10I, the tops of pillars 1034A, 1034B, 1034C may be implanted with n-type dopant 1022 through a window defined by a new mask 1020C. The n-type dopant 1022 may form an N+ region at the top level of the semiconductor material of the pillars 1034A, 1034B, 1034C. The N+ region, in turn, may be operable as cathode-emitter regions 1043 of thyristors 1053.

Figure 10J:
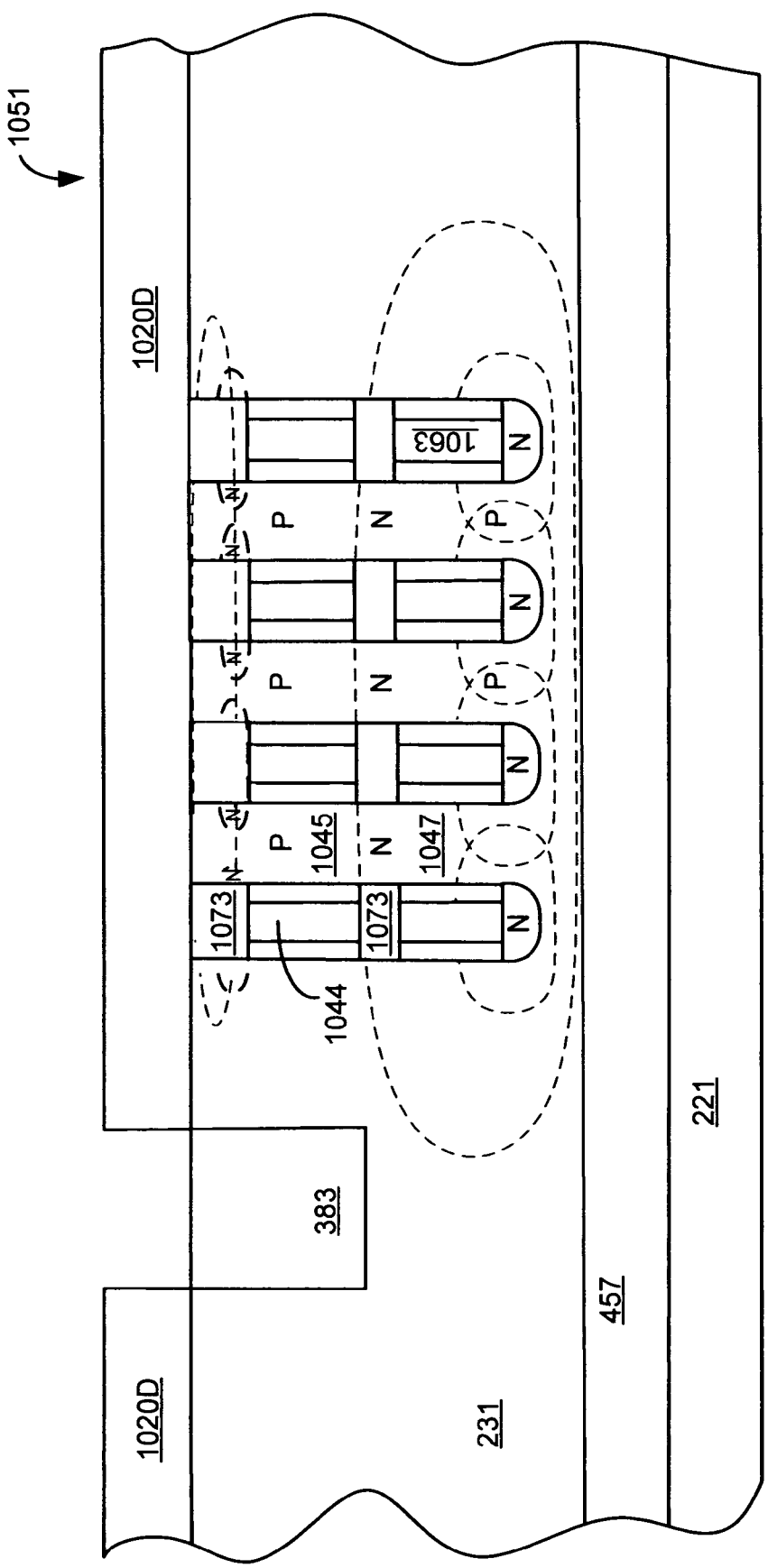
FIG. 10J is a simplified cross-sectional view of the semiconductor device of FIG. 10A in another stage of fabrication according to a method of fabricating a semiconductor device for an embodiment, showing the formation of shallow isolation trenches.

Referencing FIG. 10J, mask 1020C may be removed and replaced by mask 1020D, defining a window of exposed relaxed silicon germanium material 231. The exposed regions of the relaxed silicon germanium 231 may then be etched to form a shallow trench, which may be subsequently filled with insulative material to form a shallow trench isolation structure 383.

Figure 10K:
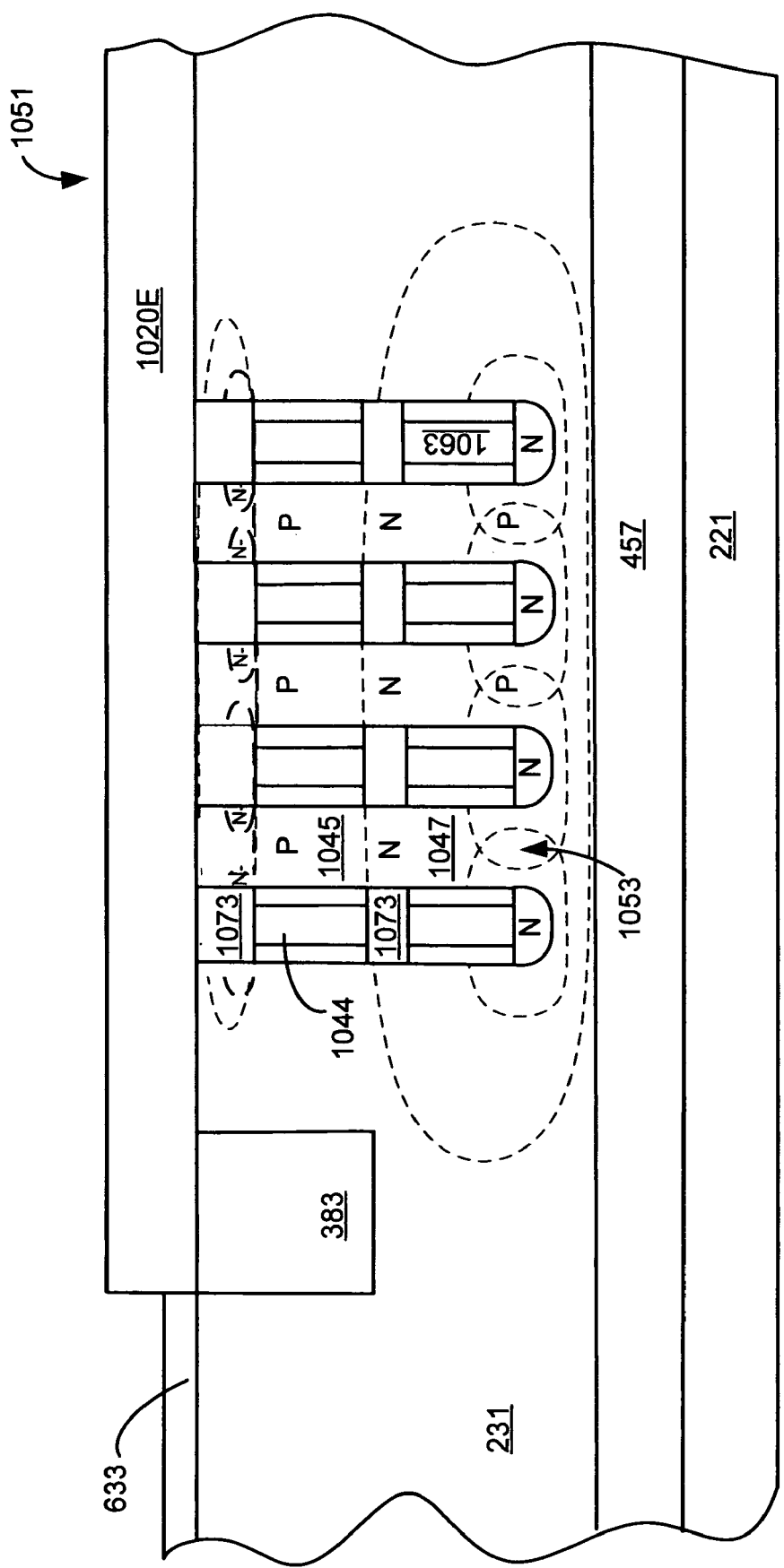
FIG. 10K is a simplified cross-sectional view of the semiconductor device of FIG. 10A in another stage of fabrication according to a method of fabricating a semiconductor device for an embodiment, showing the formation of a region of strained silicon.

Referencing FIG. 10K, mask 1020D may be removed and replaced by hard mask 1020E. In particular embodiments, mask 1020E may protect areas in which strained silicon may not be desired (e.g., areas associated with buried thyristors 1053, etc.) and to define exposed areas of silicon-germanium substrate 231.

Silicon may be formed (e.g., epitaxially formed) over the exposed areas of the silicon-germanium 231 to define regions of strained silicon 633. In particular embodiments, a preliminary shallow etch (e.g., 20 nanometers) of the exposed areas of silicon germanium may be performed before the deposition of silicon to offset the additional thickness of the deposited silicon.

Figure 10L:
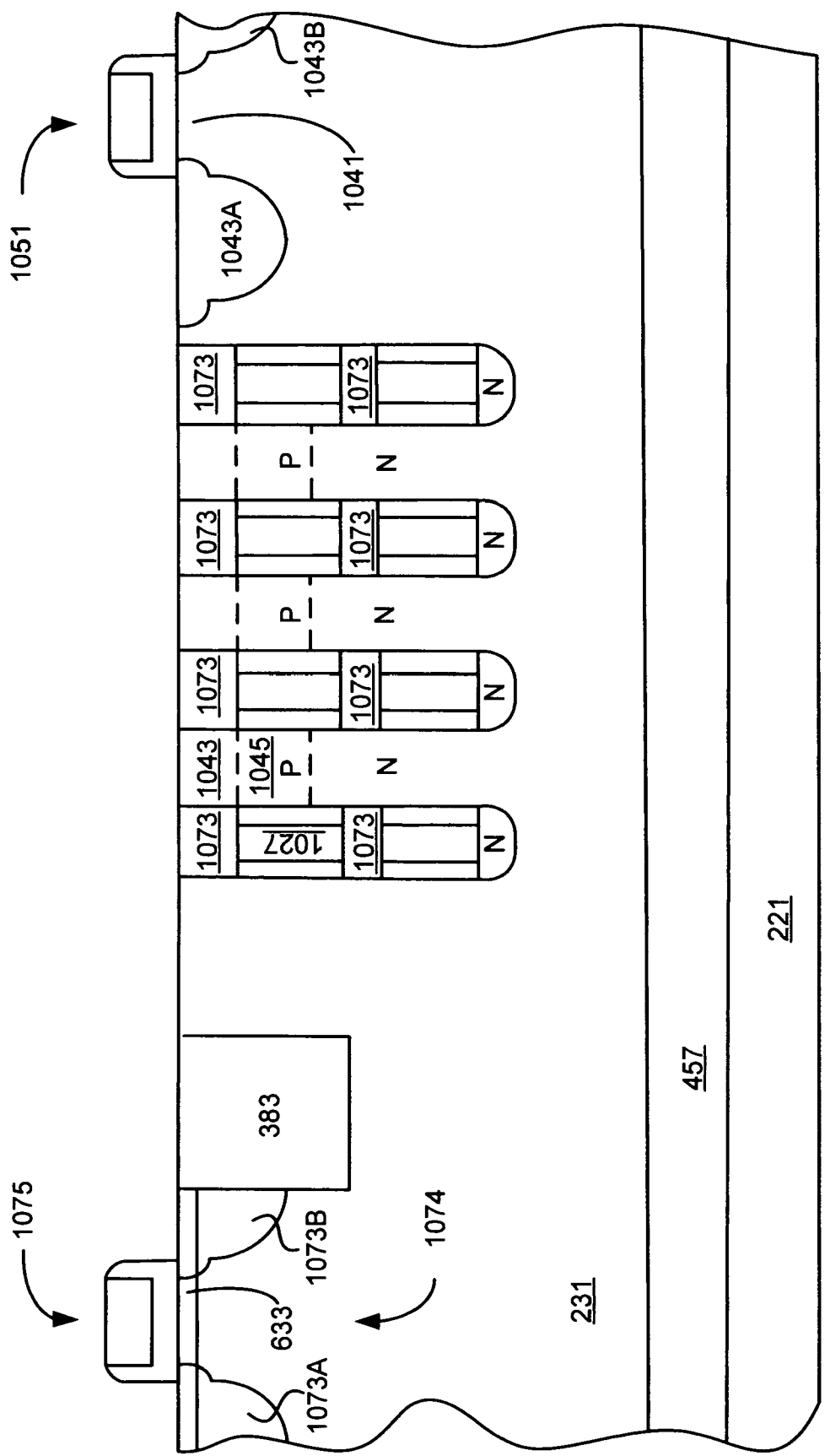
FIG. 10L is a simplified cross-sectional view of the semiconductor device of FIG. 10A in another stage of fabrication according to a method of fabricating a semiconductor device for an embodiment, showing the formation of a MOSFET in a region of a substrate comprising strained silicon.

Referencing FIG. 10L, the CMOS process may be continued to form MOSFETs 1075, 1051. In a particular embodiment, a MOSFET (e.g., 1075) may be formed in a region of the strained silicon 633. In another embodiment, another MOSFET (e.g., 1051) may be formed in a relaxed region (e.g., region of silicon-germanium 231).

In particular embodiments, the process may comprise forming lightly doped regions, forming electrodes capacitively coupled (e.g., via dielectric) to the substrate 231. In further embodiments, the CMOS process may further comprise forming dielectric spacers against sidewalls of the gate electrodes wherein deep implants may define drain/source regions (e.g., 1073A, 1073, 1043A, 1043B) aligned relative to the spacers.

The drain/source regions may be understood to define body regions therebetween (e.g., 1074, 1041). The CMOS process may be further continued to form interconnects, vias, etc. In particular embodiments, structures such as those described above with reference to FIG. 4 may be formed.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of P-N sections in the thyristor device; and interchanging P and N regions in the device structures and/or using P-MOSFETS rather than N-MOSFETS. Such, exemplary modifications and changes would not depart from the true spirit and scope of the present invention that may be set forth in the following claims.

What is claimed is:

1. A semiconductor device comprising:
   a first region comprising relaxed silicon;
   a second region comprising strained silicon on silicon germanium;
   a thyristor-based memory array comprising thyristor-based memory elements formed at least in part within the first regions, and read/write interface circuits formed at least in part in the second regions; and
   insulating material of a supporting substrate;
   wherein the relaxed silicon of the first region and the silicon germanium of the second region are each over different portions of the insulating material.

2. The device of claim 1, the supporting substrate supporting the insulating material on a side thereof opposite the relaxed silicon and the silicon germanium.

3. The device of claim 1, the insulating material comprising oxide.

4. The device of claim 1, in which a given thyristor-based memory element comprises a thyristor fabricated in the first region.

5. The device of claim 4, in which the given thyristor-based memory element further comprises an access device formed in the first region.

6. The device of claim 5, the access device comprising a MOSFET.

7. The device of claim 6, further comprising combinational logic fabricated in the second region.

8. The device of claim 7, in which the combinational logic comprises at least one of a decoder, sense circuitry, read/write circuit, buffer, multiplexer and voltage reference at least partly fabricated in the second region.

9. The device of claim 8, in which the logic comprises a MOSFET incorporating a portion of the strained silicon for its channel region.

10. The device of claim 1, the first region comprising a thyristor and the second region comprising an access device operable to provide gatable access to the thyristor.

11. The device of claim 10, further comprising isolation material disposed in a trench defined in part between respective sidewalls of the second region and the first region.

12. The device of claim 1, in which a given thyristor-based memory element comprises:
a thyristor defined at least in part in the first region; and
an access device operable to enable retentive access of the thyristor and defined at least in part in the second region.

13. The device of claim 12, further comprising an interconnect to electrically couple the thyristor and the access device in series relationship.

14. The device claim 13, the access device comprising a MOSFET having a gate electrode operable under bias to effect a conductive channel in the body region between the source and drain regions; the strained silicon comprising at least part of the body region of the MOSFET for the inverted channel.

15. The device of claim 1, the silicon germanium comprising relaxed silicon germanium.

16. The device of claim 15, the silicon germanium further comprising graded silicon germanium contiguous with and disposed beneath the relaxed silicon germanium.

17. The device of claim 15, the relaxed silicon germanium comprising at least 10 percent germanium by molar fraction.

18. The device of claim 15, the relaxed silicon germanium comprising less than 30 percent germanium by molar fraction.

19. The device of claim 1, further comprising isolation material disposed in a trench defined at least in part by sidewalls of the first region and the second region.

* * * * *